United States Patent
Tsunetsugu

(10) Patent No.: US 8,803,116 B2
(45) Date of Patent: Aug. 12, 2014

(54) RECEIVING CIRCUIT HAVING A SWITCH FOR CHANGING THE GENERATED REFERENCE VOLTAGE TO ONE OF A FIRST AND A SECOND THRESHOLD VALUE

(75) Inventor: Yukio Tsunetsugu, Fukuoka-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 334 days.

(21) Appl. No.: 13/412,462

(22) Filed: Mar. 5, 2012

(65) Prior Publication Data

US 2012/0256081 A1 Oct. 11, 2012

(30) Foreign Application Priority Data

Apr. 11, 2011 (JP) .................................. 2011-087208

(51) Int. Cl.
*G02B 27/00* (2006.01)

(52) U.S. Cl.
USPC ...................................... 250/551; 250/214 R

(58) Field of Classification Search
USPC ........... 250/551, 214 R, 214.1; 327/514, 363, 327/427; 385/8, 9, 12; 330/308, 59
See application file for complete search history.

(56) References Cited

U.S. PATENT DOCUMENTS

| | | | |
|---|---|---|---|
| 5,319,265 A | 6/1994 | Lim | |
| 7,868,701 B2 * | 1/2011 | Nakamura et al. | ............ 330/308 |
| 2007/0126507 A1 | 6/2007 | Sakura | |

FOREIGN PATENT DOCUMENTS

| | | |
|---|---|---|
| JP | 03179816 A | 8/1991 |
| JP | 2003008408 A | 1/2003 |
| JP | 2007-109944 | 4/2007 |

OTHER PUBLICATIONS

Japanese Office Action dated Dec. 16, 2013, filed in Japanese counterpart Application No. 2011-087208, 4 pages (with translation).

* cited by examiner

*Primary Examiner* — Que T Le
(74) *Attorney, Agent, or Firm* — Patterson & Sheridan, LLP

(57) ABSTRACT

According to a receiving circuit includes a light receiving element, a signal voltage generation portion, a comparator, a reference voltage generation portion and a switch. The light receiving element receives a light signal and outputs a light current corresponding to the light signal. The signal voltage generation portion converts the light current into a signal voltage and outputs the signal voltage. The comparator compares the signal voltage with a first threshold value or a second threshold value. The reference voltage generation portion outputs a reference voltage input to the comparator. The switch changes the reference voltage to one of the first threshold value and the second threshold value based on an output of the comparator.

20 Claims, 18 Drawing Sheets

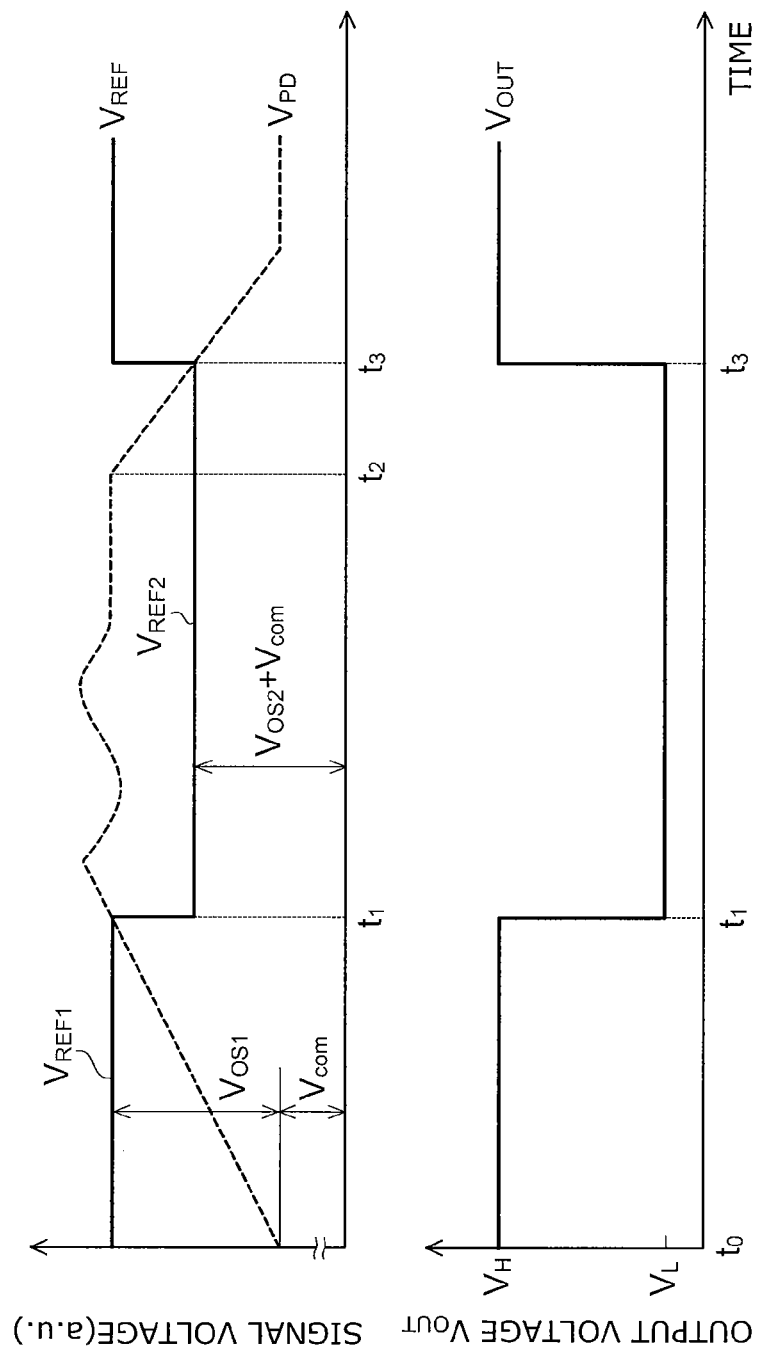

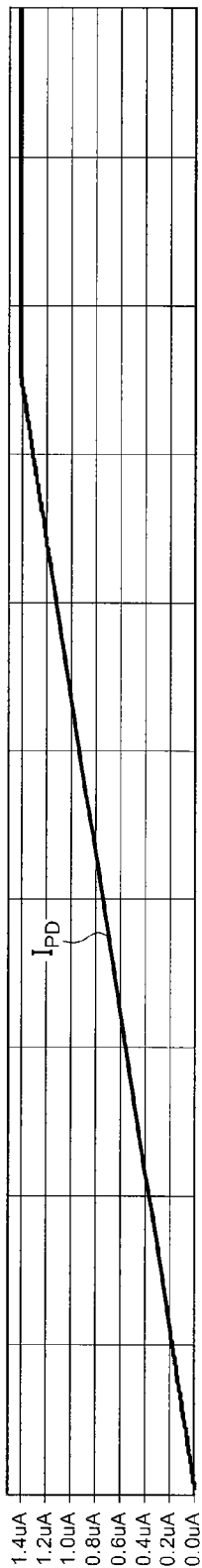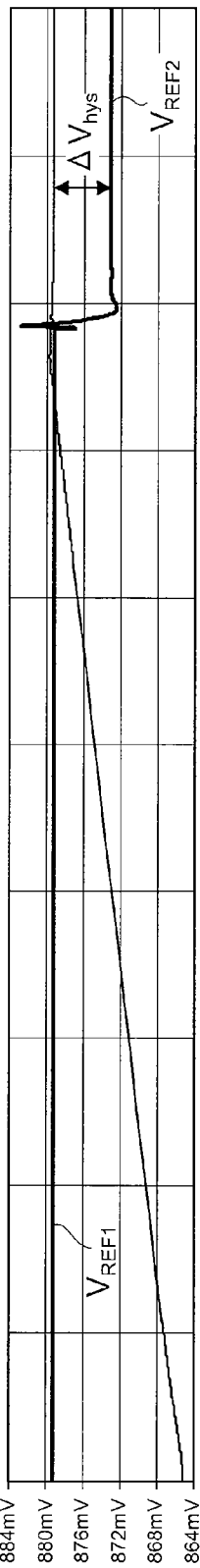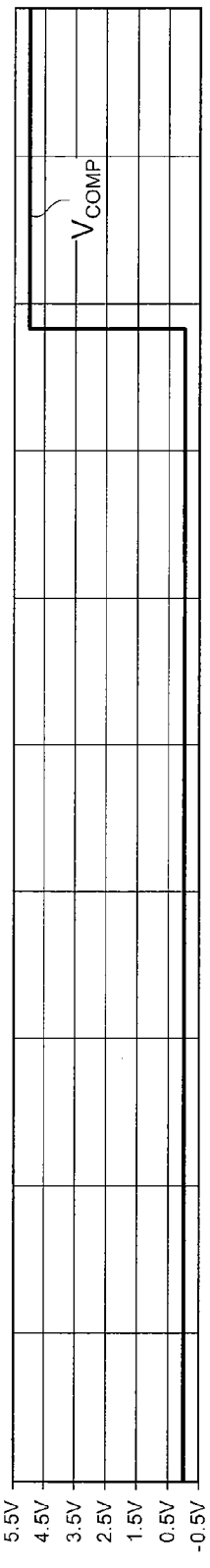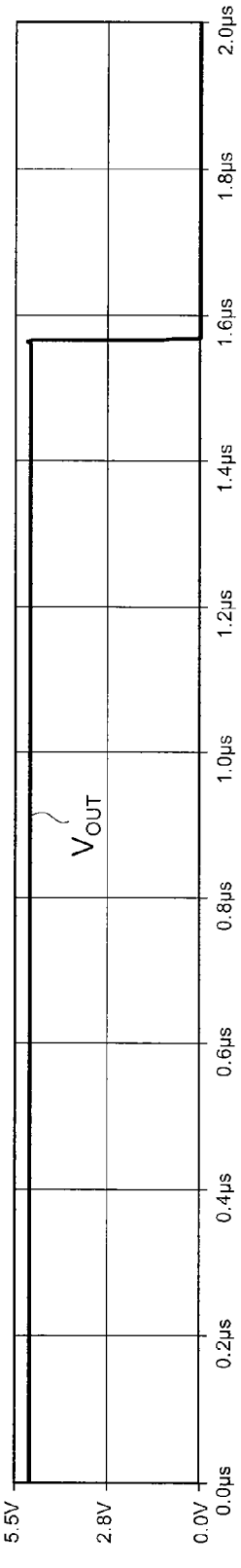

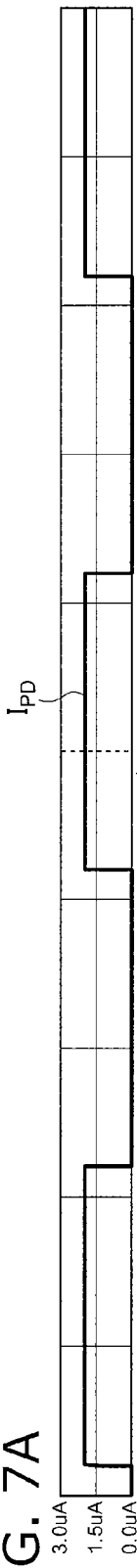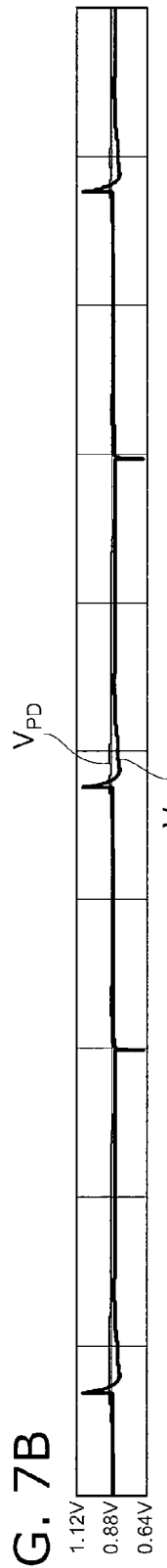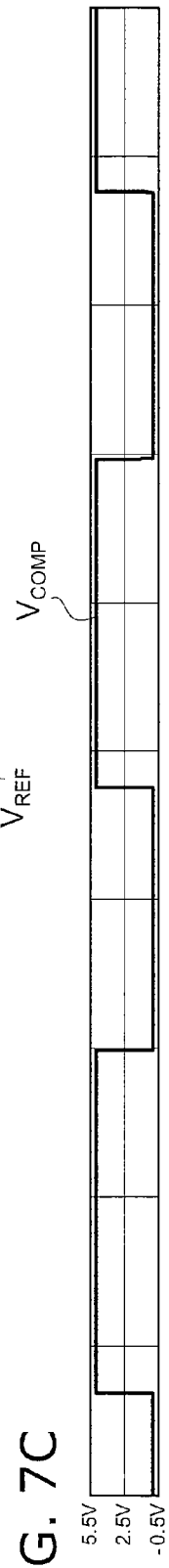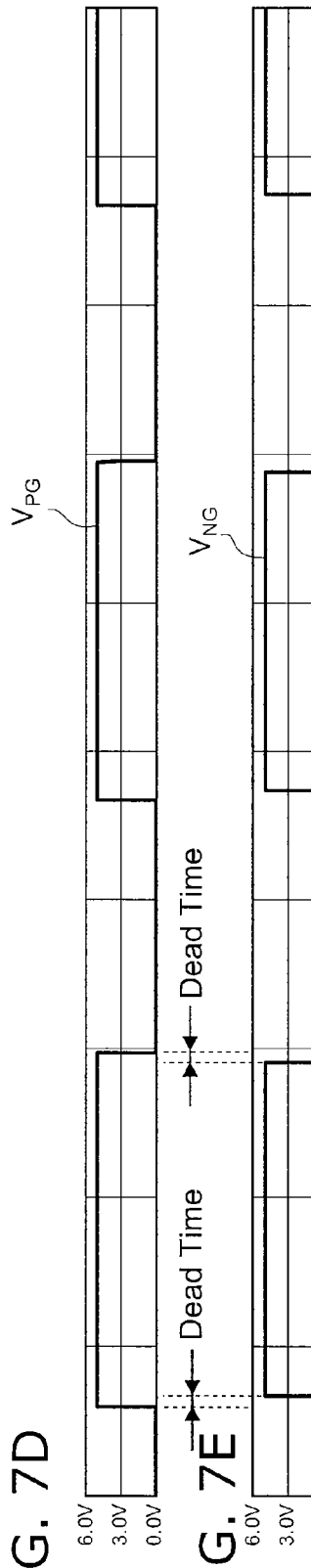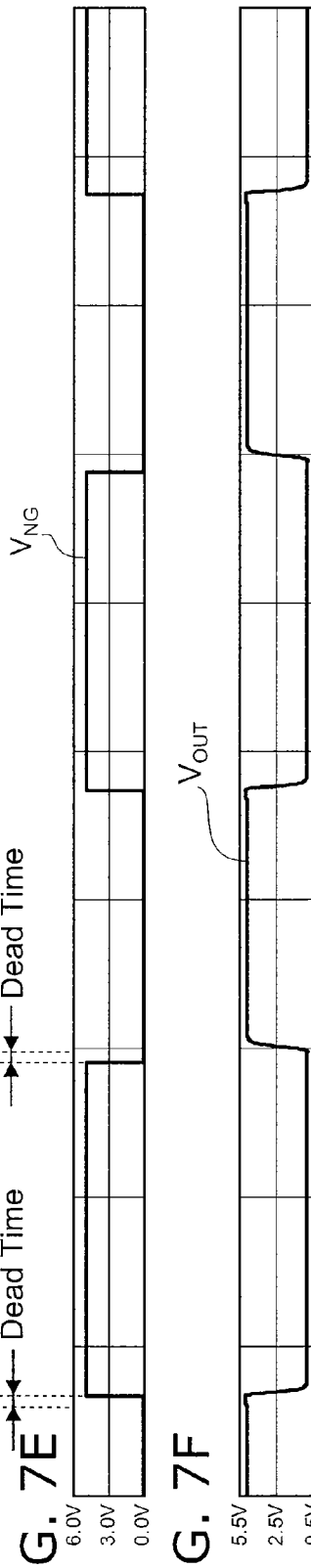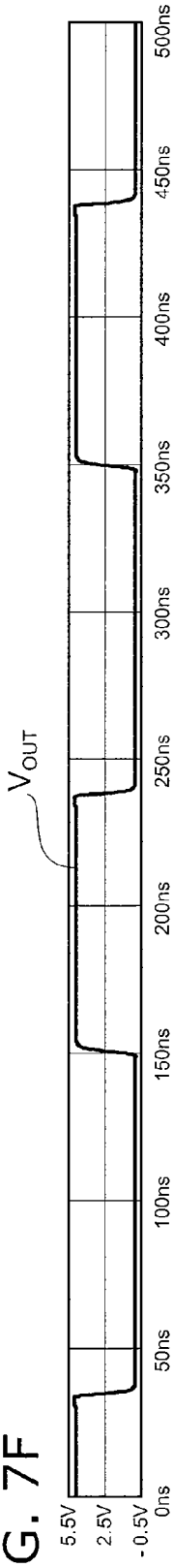

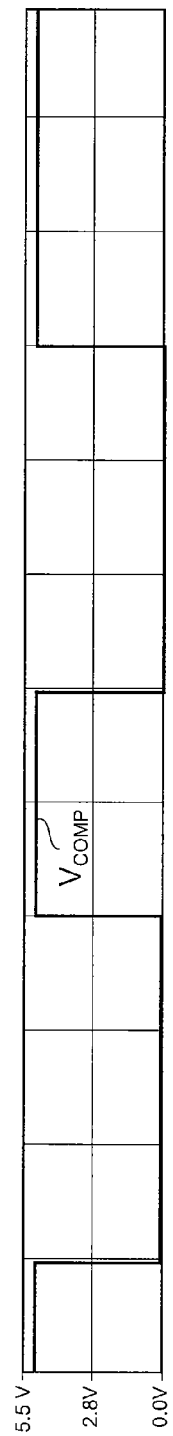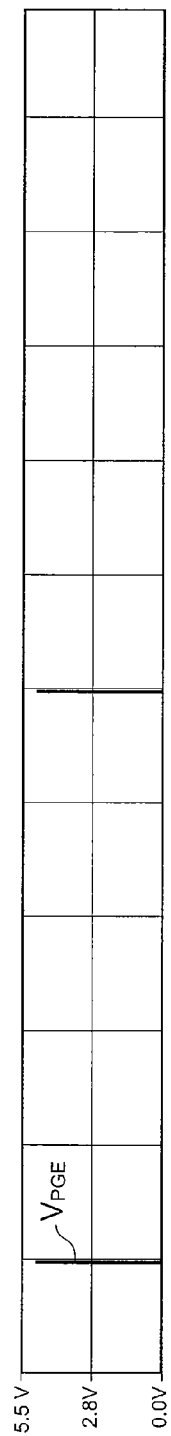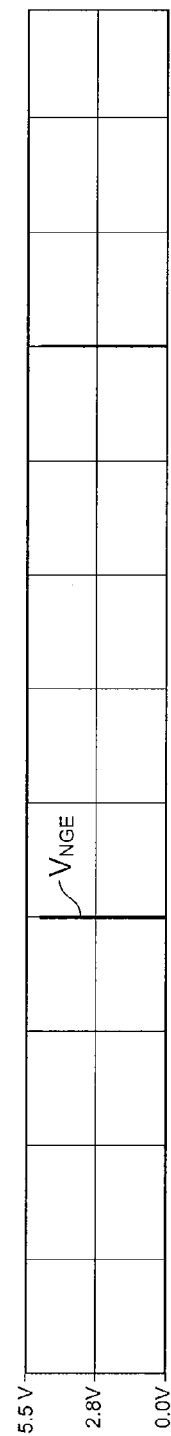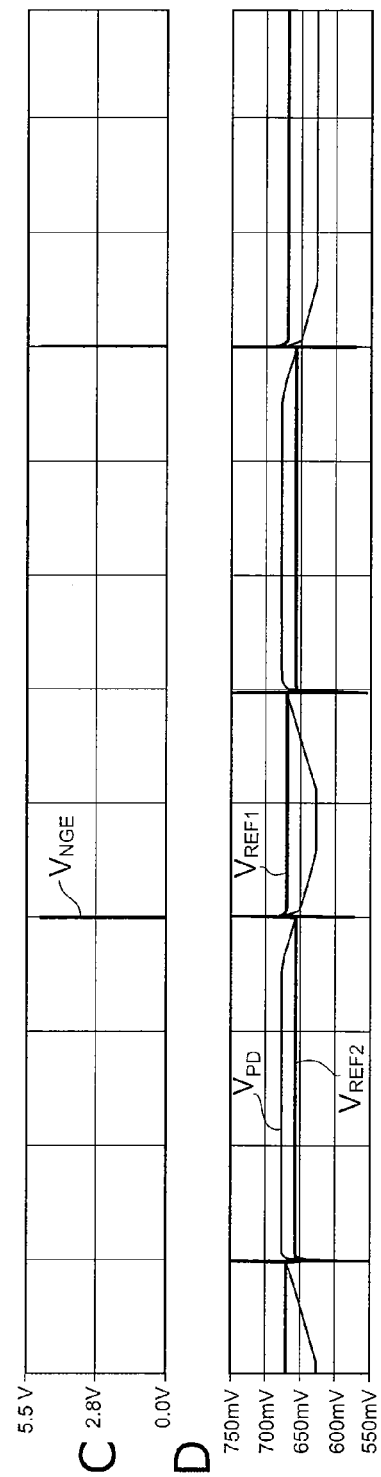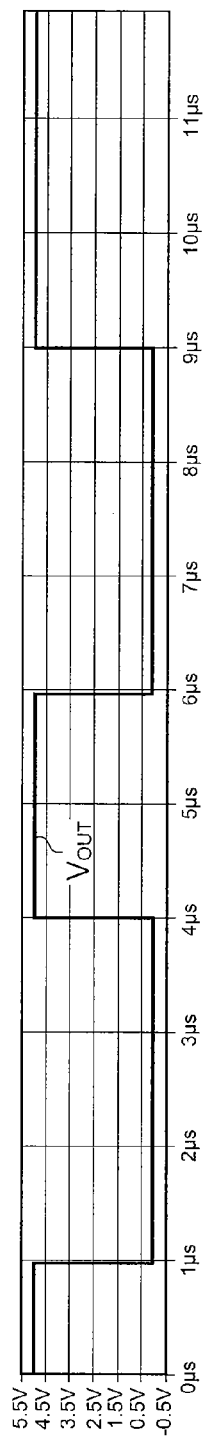

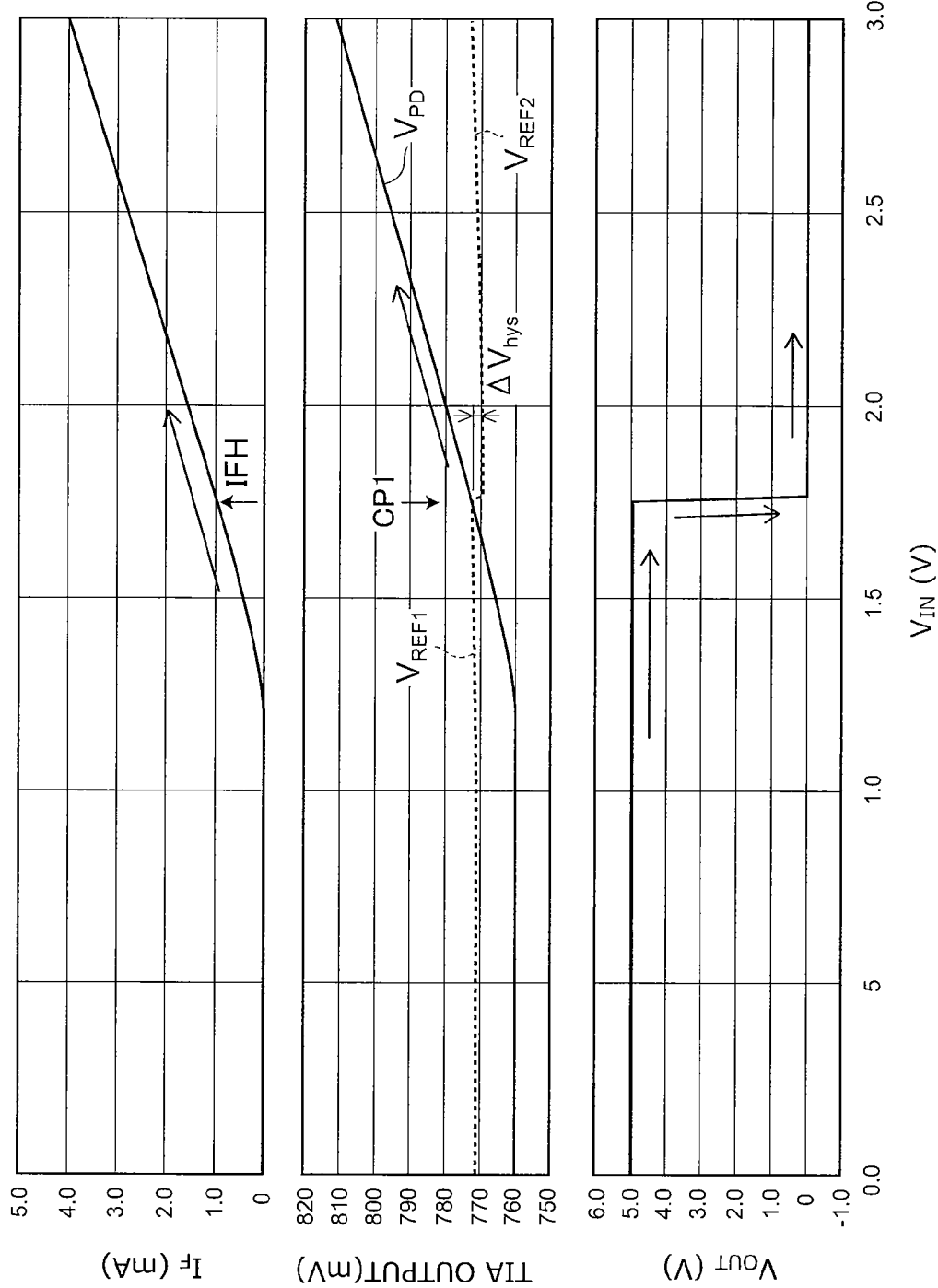

RECEIVING CIRCUIT HAVING A SWITCH FOR CHANGING THE GENERATED REFERENCE VOLTAGE TO ONE OF A FIRST AND A SECOND THRESHOLD VALUE

CROSS-REFERENCE TO RELATED APPLICATIONS

This application is based upon and claims the benefit of priority from Japanese Patent Application No. 2011-087208, filed on Apr. 11, 2011; the entire contents of which are incorporated herein by reference.

FIELD

Embodiments are generally related to a receiving circuit.

BACKGROUND

In a semiconductor device that transmits a signal via light transmission and light reception, it is important to prevent malfunction in a receiving circuit. For example, in a photo-coupler, a light receiving element receives the light signal and outputs a light current. In the receiving circuit, the light current is converted into a signal voltage and comparing the signal voltage with a threshold voltage generates an output signal. Then, an offset is set for the threshold voltage in order to prevent malfunction during a time period without the light signal.

However, when the light current rises relatively gently, a time period where the signal voltage is close to the threshold voltage is longer than a switching time. Then, variations in the signal voltage often induce chattering in the output signal, resulting in a malfunction.

BRIEF DESCRIPTION OF THE DRAWINGS

FIGS. 2A and 2B are time charts schematically illustrating an operation of the receiving circuit according to the first embodiment;

FIGS. 3A to 3D are time charts illustrating simulation results of the receiving circuit according to the first embodiment;

FIGS. 7A to 7F are time charts illustrating an operation of the DTC circuit;

FIGS. 14A to 14E are time charts illustrating a simulation result of the receiving circuit according to the second embodiment;

FIGS. 16A to 17C are charts illustrating the characteristics of the receiving circuit according to a third embodiment;

DETAILED DESCRIPTION

Figure 1:
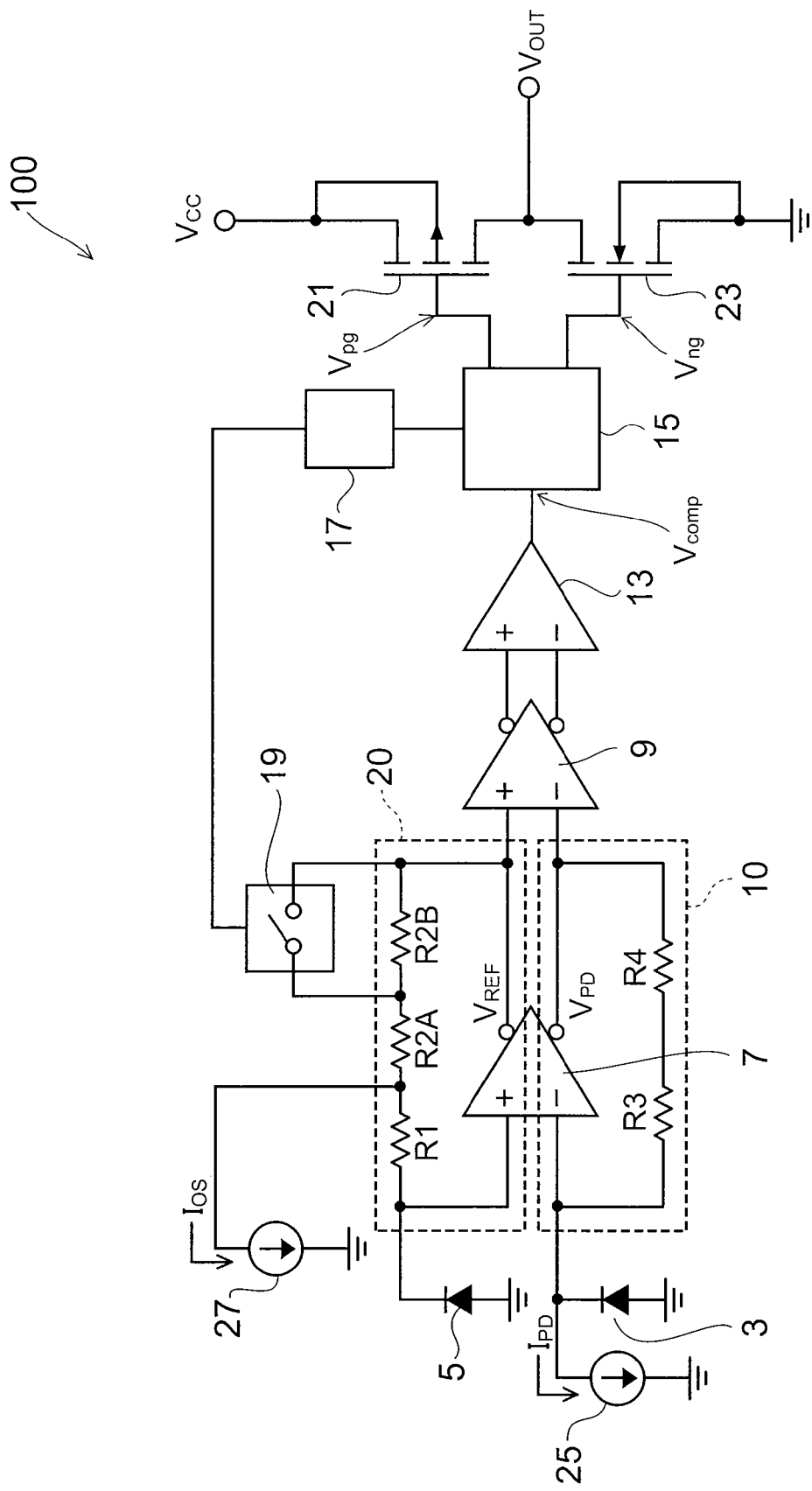
FIG. 1 is a schematic view illustrating a receiving circuit according to a first embodiment.

According to a receiving circuit includes a light receiving element, a signal voltage generation portion, a comparator, a reference voltage generation portion and a switch. The light receiving element receives a light signal and outputs a light current corresponding to the light signal. The signal voltage generation portion converts the light current into a signal voltage and outputs the signal voltage. The comparator compares the signal voltage with a first threshold value or a second threshold value. The reference voltage generation portion outputs a reference voltage input to the comparator. The switch changes the reference voltage to one of the first threshold value and the second threshold value based on an output of the comparator.

Embodiments of the invention will now be described with reference to the drawings. In the drawings, like parts are marked with like numerals, their detailed description will not be repeated as appropriate and different parts will be described.

First Embodiment

FIG. 1 is a schematic view showing a receiving circuit 100 according to a first embodiment. The receiving circuit 100 is a receiving portion of a photo-coupler, for example.

The receiving circuit 100 includes a photodiode 3 that is a light receiving element, a transimpedance amplifier (TIA) 7, a differential amplifier 9 and a comparator 13.

As shown in FIG. 1, the photodiode 3 is connected to the negative input of the TIA 7. The photodiode 3 receives a light signal from a transmission portion (not illustrated) and outputs a light current $I_{PD}$. Then, the TIA 7 outputs a signal voltage $V_{PD}$ to a negative output terminal. The light current $I_{PD}$ is converted into the signal voltage $V_{PD}$ as indicated by formula (1).

$$V_{PD}=(R3+R4) \times I_{PD} \qquad (1)$$

In contrast, a reference diode 5 is connected to the positive input of the TIA 7, and a reference voltage $V_{REF}$ is output to a positive output terminal of the TIA 7. It is preferable for the reference diode 5 to use a diode equivalent to the photodiode 3. For example, the photodiode 5 is provided on the same substrate as the photodiode 3, being equal in size to the photodiode 3, and having a shielded light receiving face.

Here, the term "equivalent" means that parameters for an equivalent circuit except a current source 25 corresponding to the light current $I_{PD}$ are the same between the photodiode 3 and the reference diode 5. In addition, the term "same" includes not only a case where they are exactly equal but also a case where they are approximately the same, allowing small variations caused by circuit arrangement and processing accuracy.

As shown in FIG. 1, a circuit on the negative input side of the TIA 7 constitutes a signal voltage generation portion 10, and converts the light current $I_{PD}$ into the signal voltage $V_{PD}$ and outputs it. Then, a circuit on the positive input side constitutes a reference voltage generation portion 20, and outputs the reference voltage $V_{REF}$.

Feedback resistors R3 and R4 provided in the signal voltage generation portion 10 and feedback resistors R1, R2A and R2B provided in the reference voltage generation portion 20 satisfy a relationship in the following formula.

$$R1+R2A+R2B=R3+R4 \qquad (2)$$

Hence, the TIA 7 operates in all differential modes.

The outputs $V_{PD}$ and $V_{REF}$ of the TIA 7 are amplified by the differential amplifier 9, and are input to the comparator 13. In the comparator 13, the reference voltage $V_{REF}$ is set to a threshold value, the level of the signal voltage $V_{PD}$ is determined and a high-level or low-level voltage is output. For example, when the $V_{PD}$ is higher than the $V_{REF}$, a high-level voltage $V_H$ is output whereas, when the $V_{PD}$ is lower than the $V_{REF}$, a low-level voltage $V_L$ is output.

In the receiving circuit 100, since the photodiode 3 is equivalent to the reference diode 5, when no light signal is input, the outputs $V_{PD}$ and $V_{REF}$ of the TIA 7 are equal in voltage level. Therefore, an offset voltage $V_{OS}$ is added for stabilizing the output of the comparator 13. That is, as shown in FIG. 1, a constant current source 27 is connected to the feedback circuit of the reference voltage generation portion 20, allowing an offset current $I_{OS}$ to flow. Thereby, an offset voltage $V_{OS1}$ indicated by formula (3) below is added to the reference voltage $V_{REF}$.

$$V_{OS1}=(R2A+R2B)\times I_{OS} \qquad (3)$$

Furthermore, the output signal of the comparator 13 is processed by a DTC (dead time control) circuit 15. Based on the output signal of the comparator 13, the DTC circuit 15 outputs gate control signals to a PMOS transistor 21 and an NMOS transistor 23, and the DTC circuit 15 also output a control signal to a switch control circuit 17.

The PMOS transistor 21 and the NMOS transistor 23 constitute an output stage that is configured with a CMOS inverter where the drain electrodes thereof are connected. In contrast, the switch control circuit 17 outputs a control signal to an analogue switch 19.

The analogue switch 19 is connected in parallel to a feedback resistor R2B of the TIA 7, and, while the analogue switch 19 is in on-state, it short-circuits the feedback resistor R2B. Thus, it is possible to switch the value of the feedback resistor of the TIA 7 and change the offset voltage $V_{OS}$. That is, when the analogue switch 19 is turned on, the offset voltage $V_{OS}$ is changed from $V_{OS1}$ to a voltage level $V_{OS2}$ indicated by formula (4) below, and thus the level of the reference voltage $V_{REF}$ is changed.

$$V_{OS2}=R2A\times I_{OS} \qquad (4)$$

As described above, the receiving circuit 100 changes the level of the reference voltage $V_{REF}$ based on the output of the comparator 13.

FIGS. 2A and 2B are time charts schematically showing the operation of the receiving circuit 100. FIG. 2A shows the time variation of the signal voltage $V_{PD}$ and the reference voltage $V_{REF}$. FIG. 2B shows the time variation of an output voltage $V_{OUT}$.

In the receiving circuit 100, for example, when an output of the reference voltage generation portion 20 is set to $V_{COM}$ corresponding to the reverse leak current of the reference diode 5, the reference voltage $V_{REF}$ is equal to the sum of the offset voltages $V_{OS}$ and $V_{COM}$. Then, the reference voltage $V_{REF}$ is input to the comparator 13 as a first threshold value $V_{REF1}$ or a second threshold value $V_{REF2}$ for determining the level of the $V_{PD}$.

$$V_{REF1}=V_{OS1}+V_{COM} \qquad (5)$$

$$V_{REF2}=V_{OS2}+V_{COM} \qquad (6)$$

As described previously, since the photodiode 3 and the reference diode 5 are equivalent to each other, the $V_{COM}$ is equal to the output of the signal voltage generation portion 10, while non light signal is input.

As shown in FIG. 2A, when the light signal is turned on at time $t_0$, and is input to the photodiode 3, the level of the signal voltage $V_{PD}$ starts to increase. Then, the output of the comparator 13 is inverted, when the $V_{PD}$ exceeds the first threshold value $V_{REF1}$ at time $t_1$, and, for example, the output voltage is shifted from the $V_H$ to the $V_L$ as shown in FIG. 2B.

Simultaneously, based on the change in the output of the comparator 13, the switch control circuit 17 outputs a control signal, and the analogue switch 19 is turned on. Then, the reference voltage $V_{REF}$ is changed from the $V_{REF1}$ to the $V_{REF2}$.

As shown in FIG. 2A, even if the level of the $V_{PD}$ is varied after the time $t_1$, as long as the threshold value is decreased from the $V_{REF1}$ to the $V_{REF2}$, the $V_{PD}$ is prevented from being lower than the second threshold value $V_{REF2}$. Hence, it is possible to stabilize the output of the comparator 13 and prevent malfunction.

Furthermore, when the light signal is turned off at time $t_2$, the $V_{PD}$ starts to decrease. Then, the output of the comparator 13 is inverted, when the $V_{PD}$ becomes lower than the second threshold value $V_{REF2}$ at time $t_3$, and the output voltage $V_{OUT}$ is shifted from $V_L$ to the $V_H$. Simultaneously, the analogue switch 19 is turned off; the offset voltage $V_{OS}$ is returned from the $V_{OS2}$ to the $V_{OS1}$; and the threshold value is shifted from the $V_{REF2}$ to the $V_{REF1}$.

FIGS. 3A to 3D are time charts showing an example of the simulation results of the receiving circuit 100. FIG. 3A shows variations in the light current $I_{PD}$, and FIG. 3B shows variations in the signal voltage $V_{PD}$ and the reference voltage $V_{REF}$. FIG. 3C shows the $V_{COMP}$ of the comparator 13 and FIG. 3D shows the output voltage $V_{OUT}$.

As shown in FIG. 3A, in this simulation model, a time period during which $I_{PD}$ rises is set relatively long so that the variations in the $I_{PD}$ easily cause chattering.

As shown in FIG. 3B, the reference voltage $V_{REF}$ is either the first threshold value $V_{REF1}$ or the second threshold value $V_{REF2}$. When a period of 1.5 μs elapses after the light signal enters, the signal voltage $V_{PD}$ exceeds the first threshold value $V_{REF1}$. Then, the analogue switch 19 is turned on, and the reference voltage is decreased to the second threshold value $V_{REF2}$. In response to this, as shown in FIG. 3C, the output $V_{COMP}$ of the comparator 13 is inverted from 0 V to 5 V, and the output voltage $V_{OUT}$ shown in FIG. 3D is shifted from 5 V to 0 V.

Figure 4A:
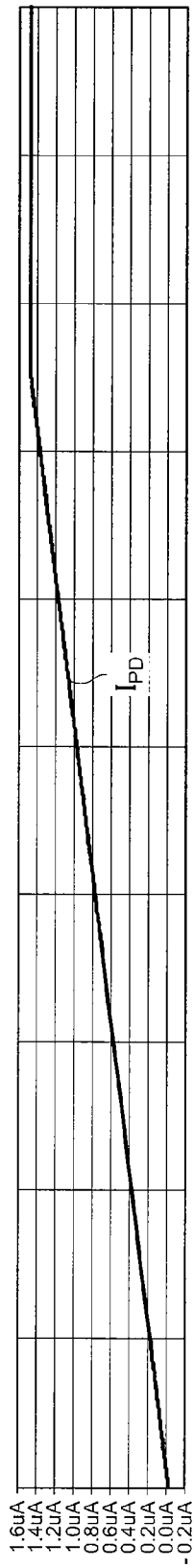
FIGS. 4A to 4D are time charts illustrating simulation results of a receiving circuit according to a comparative example.
Figure 4B:
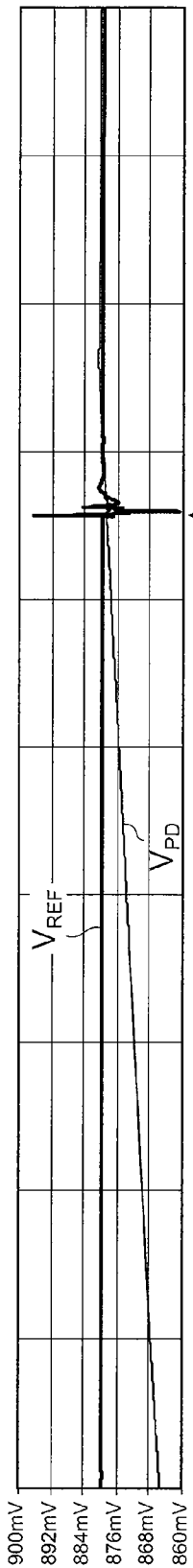
Figure 4C:
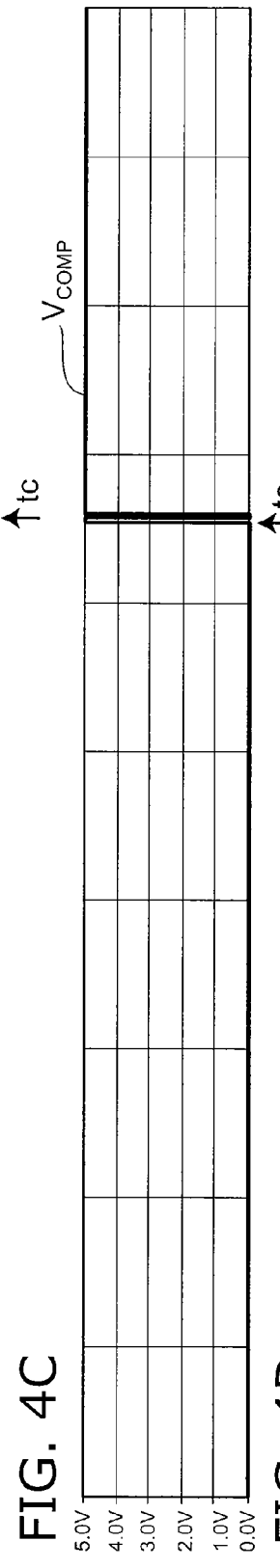
Figure 4D:
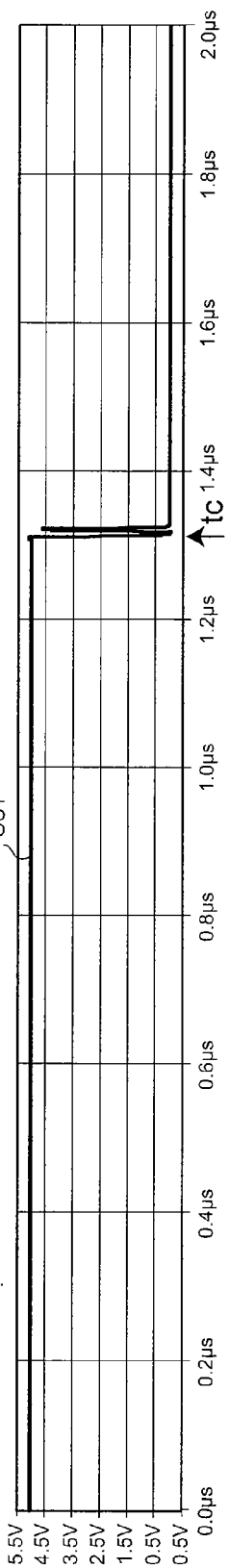

FIGS. 4A to 4D are time charts showing the simulation results of the receiving circuit according to a comparative example. FIG. 4A shows variations in the light current $I_{PD}$, and FIG. 4B shows variations in the signal voltage $V_{PD}$ and the reference voltage $V_{REF}$. Then, FIG. 4C shows variations in the output $V_{COMP}$ of the comparator 13, and FIG. 4D shows variations in the output voltage $V_{OUT}$.

In the receiving circuit according to the comparative example, the analogue switch 19 is not provided, and the offset voltage $V_{OS}$ is not varied. Therefore, as shown in FIG. 4B, the reference voltage $V_{REF}$ remains constant, i.e. the threshold value of the comparator 13 is not changed. For example, when the $V_{PD}$ exceeds the $V_{REF}$ at time $t_c$ shown in the figure, the output $V_{COMP}$ of the comparator 13 is inverted. Then, as shown in FIG. 4C, the variation in the $V_{PD}$ sometime causes chattering in which the output $V_{COMP}$ of the comparator 13 is repeatedly inverted. Then, as shown in FIG. 4D, chattering is caused also in the output voltage $V_{OUT}$.

In contrast, in the receiving circuit 100 according to the embodiment, as shown in FIGS. 3C and 3D, when the output of the comparator 13 is inverted and the output voltage $V_{OUT}$ is shifted, chattering is not caused. That is, by providing the analogue switch 19, and causing the reference voltage $V_{REF}$ to have hysteresis $\Delta V_{hys}$, it is possible to reduce chattering.

Figure 5A:
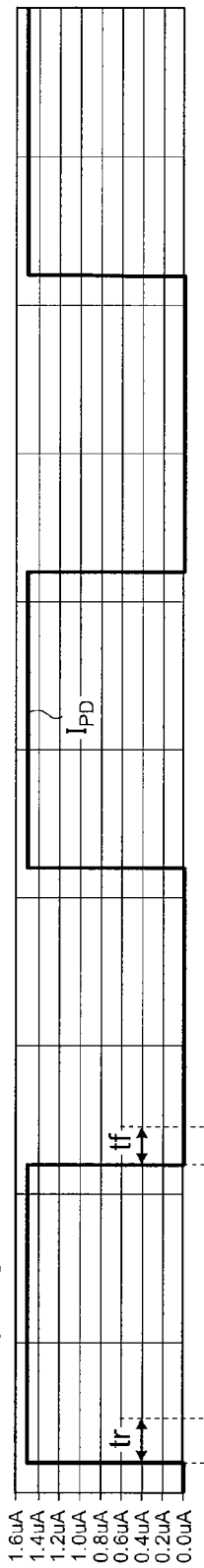
FIGS. 5A to 5D are time charts illustrating other simulation results of the receiving circuit according to the first embodiment.
Figure 5B:
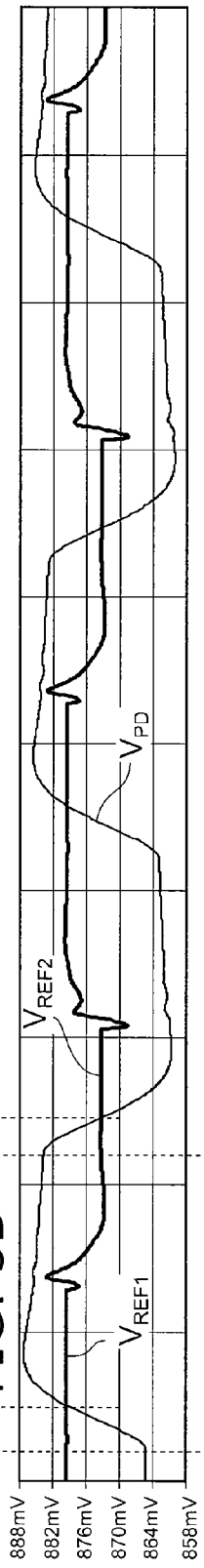
Figure 5C:
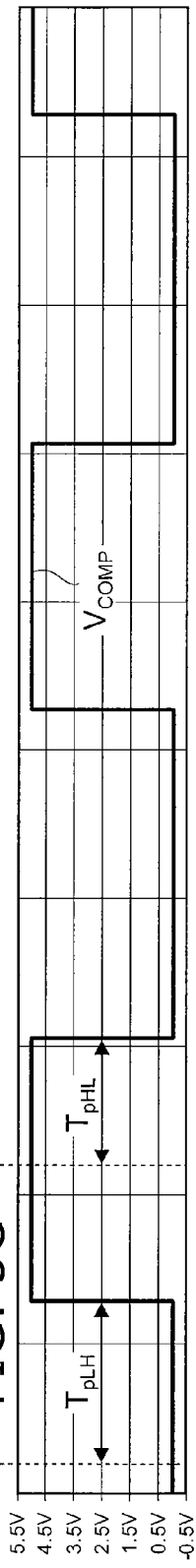
Figure 5D:
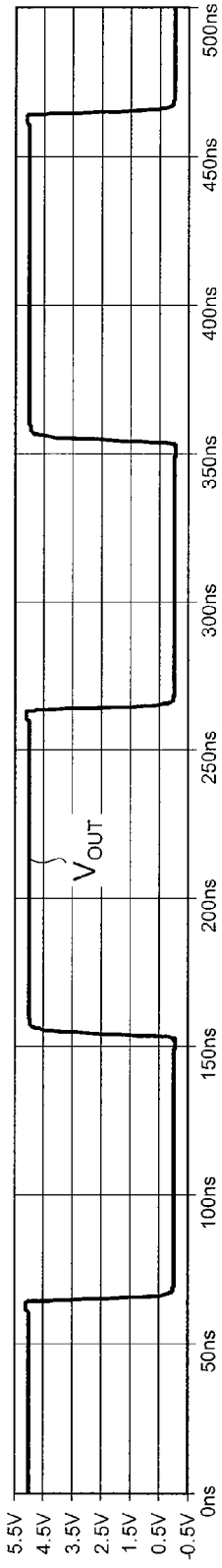

FIGS. 5A to 5D are time charts showing other simulation results of the receiving circuit 100. FIG. 5A shows variations in the light current $I_{PD}$. FIG. 5B shows variations in the signal voltage $V_{PD}$ and the reference voltage $V_{REF}$. FIGS. 5C and 5D respectively show the output $V_{COMP}$ of the comparator 13 and the output voltage $V_{OUT}$.

As shown in FIG. 5A, the photodiode 3 receives a light signal of a constant period, and outputs the light current $I_{PD}$ corresponding to the light signal. In contrast, the signal voltage $V_{PD}$ is output from the signal voltage generation portion 10 as a pulse signal having constant rising time $t_r$ and falling time $t_f$.

As shown in FIG. 5B, when the signal voltage $V_{PD}$ starts to rise and the signal voltage $V_{PD}$ exceeds the first threshold value $V_{REF1}$, the output of the comparator 13 is inverted. Since this simulation includes a transmission delay time $T_{PLH}$ as shown in FIG. 5C, the output $V_{COMP}$ of the comparator 13 is inverted with the delay time $T_{PLH}$ from a cross point between the $V_{PD}$ and the $V_{REF1}$ in the rise. Then, the analogue switch 19 becomes on-state, and the reference voltage $V_{REF}$ is decreased to the second threshold value $V_{REF2}$.

When the light current $I_{PD}$ is turned off, the signal voltage $V_{PD}$ decreases in a fall region. Then, when the signal voltage $V_{PD}$ becomes lower than the second threshold value $V_{REF2}$, the output of the comparator 13 is inverted from 5 V to 0 V. In this case, the inverse of the comparator is delayed by the transmission delay time $T_{PHL}$. Simultaneously, the analogue switch 19 is turned off, and the reference voltage $V_{REF}$ is returned to the $V_{REF1}$.

The output voltage $V_{OUT}$ shown in FIG. 5D is varied according to the output $V_{COMP}$ of the comparator 13. In the receiving circuit 100, the voltage is shifted from $V_H$ ($V_{CC}$=5 V) to $V_L$ (0 V) by the input (the turning on) of the light signal, and is returned to $V_H$ by the turning off of the light signal. Here, it is found that the voltage is smoothly shifted from $V_H$ to $V_L$, suppressing the chattering.

Next, the DTC (dead time control) circuit 15, the switch control circuit 17 and the analogue switch 19 are described with reference to FIGS. 6 to 10.

Figure 6:
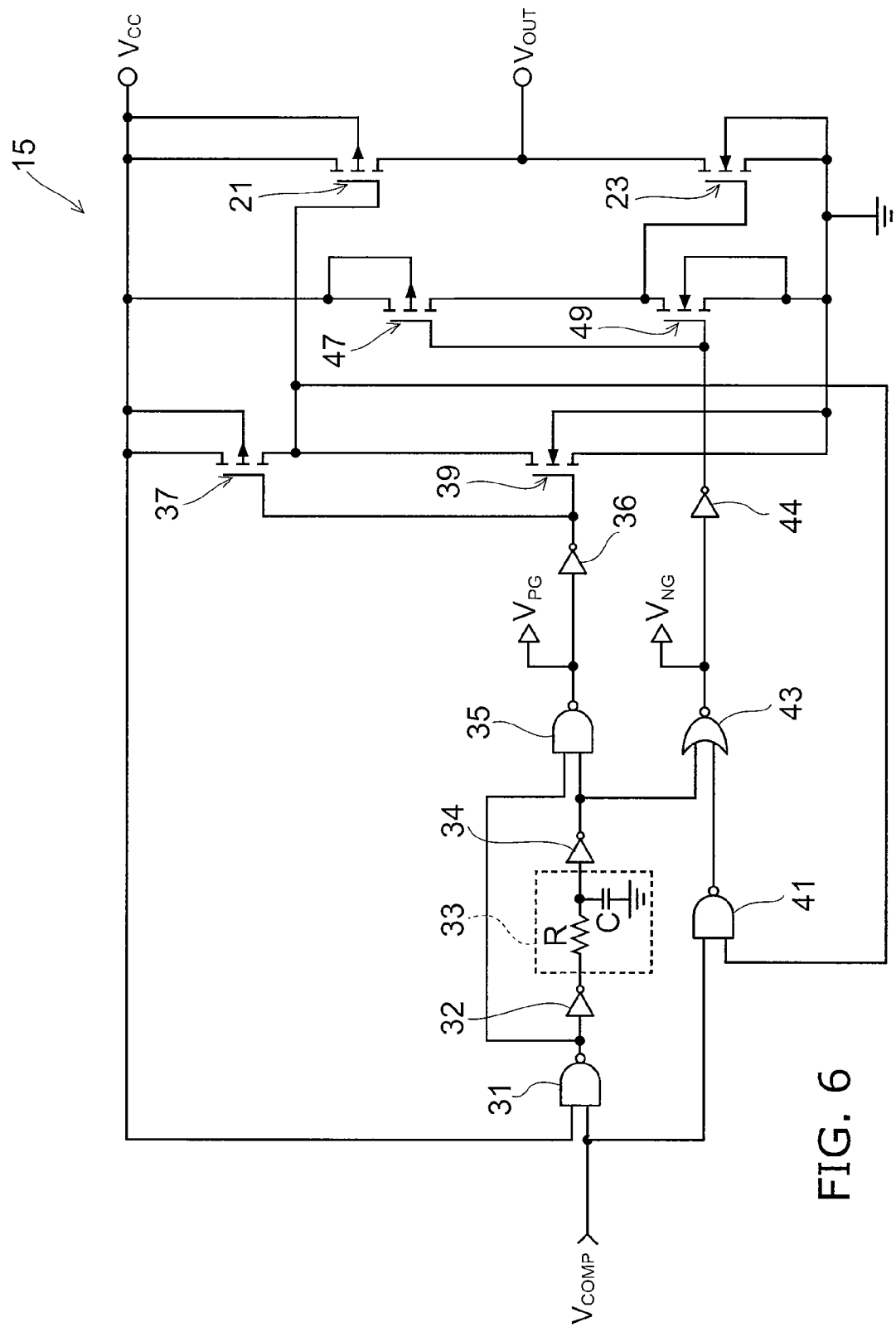
FIG. 6 is a schematic view illustrating a DTC circuit included in the receiving circuit according to the first embodiment.

FIG. 6 is a schematic view illustrating the DTC circuit 15. The DTC circuit 15 outputs gate control signals $V_{PG}$ and $V_{NG}$, which are input to the gates of the PMOS transistor 21 and the NMOS transistor 23 in the output stage.

As shown in FIG. 6, the output $V_{COMP}$ of the comparator 13 is input to NAND gates 31 and 41 in the input stage of the DTC circuit 15. Since the $V_{COMP}$ and the power $V_{CC}$ are input to the NAND gate 31, when the $V_{COMP}$ is the $V_H$, the $V_L$ is output whereas, when the $V_{COMP}$ is the $V_L$, the $V_H$ is output.

The output of the NAND gate 31 is input to the NAND gate 35. As shown in FIG. 6, the direct output of the NAND gate 31 and the output via an inverter 32, a delay circuit 33 and an inverter 34 are input to the NAND gate 35. Then, the NAND gate 35 outputs a gate control signal $V_{PG}$ for the PMOS transistor 21 in the output stage. The gate control signal $V_{PG}$ is input via an inverter 36 to the gate of a CMOS invertor constituted by a PMOS transistor 37 and an NMOS transistor 39, and its output is input to the gate of the PMOS transistor 21.

In contrast, the $V_{COMP}$ and the $V_{PG}$ inverted by the CMOS inverter are input to the NAND gate 41. Then, the output of the NAND gate 41 and the output of the NAND gate 31 via the delay circuit 33 are input to a NOR gate 43.

The NOR gate 43 outputs a gate control signal $V_{NG}$ for the NMOS transistor 23 in the output stage. The gate control signal $V_{PG}$ is input via an inverter 44 to the gate of a CMOS invertor constituted by a PMOS transistor 47 and an NMOS transistor 49, and its output is input to the gate of the NMOS transistor 23.

FIGS. 7A to 7F are time charts illustrating the operation of the DTC circuit 15. FIG. 7A shows the light current $I_{PD}$, and FIG. 7B shows the signal voltage $V_{PD}$ and the reference voltage $V_{REF}$. FIG. 7C shows the output $V_{COMP}$ of the comparator 13, FIG. 7D shows the gate control signal $V_{PG}$, and FIG. 7E shows the gate control signal $V_{NG}$. FIG. 7F shows the output voltage $V_{OUT}$.

As described previously, the signal voltage $V_{PD}$ corresponding to the light signal $I_o$ shown in FIG. 7A is output from the TIA 7, and is compared with the comparator 13 with the reference voltage $V_{REF}$ which is a threshold value. Then, the $V_{COMP}$ shown in FIG. 7C is output from the comparator 13.

The output $V_{COMP}$ of the comparator 13 is input to the two NAND gates 31 and 41 in the input stage of the DTC circuit 15. Then, the DTC circuit 15 outputs the gate control signal $V_{PG}$ shown in FIG. 7D and the gate control signal $V_{NG}$ shown in FIG. 7E.

The gate control signal $V_{PG}$ is applied to the gate of the PMOS transistor 21 in the output stage, and the gate control signal $V_{NG}$ is applied to the gate of the NMOS transistor 23. For example, the output voltage $V_{OUT}$ shifts from the $V_H$ to the $V_L$ shown in FIG. 7F at the timing of the rise of the $V_{NG}$, and shifts from the $V_L$ to the $V_H$ at the timing of the fall of the $V_{PG}$.

The gate control signal $V_{PG}$ shown in FIG. 7D is obtained by adding a delay portion (dead time) generated by the delay circuit 33 to the output waveform of the $V_{COMP}$, increasing the pulse width of the $V_{COMP}$. In contrast, the gate control signal $V_{NG}$ shown in FIG. 7E is obtained by removing a portion corresponding to a delay time (dead time) of the delay circuit 33, from a front portion of the output waveform of the $V_{COMP}$, reducing the pulse width of the $V_{COMP}$.

That is, the pulse width of the gate control signal $V_{PG}$ is formed so as to be larger backward and forward than the pulse width of the gate control signal $V_{NG}$. In this way, the PMOS transistor 21 to which the gate control signal $V_{PG}$ is applied and the NMOS transistor 23 to which the gate control signal $V_{NG}$ is applied are prevented from being simultaneously turned on, and thus it is possible to prevent malfunction.

Figure 8:
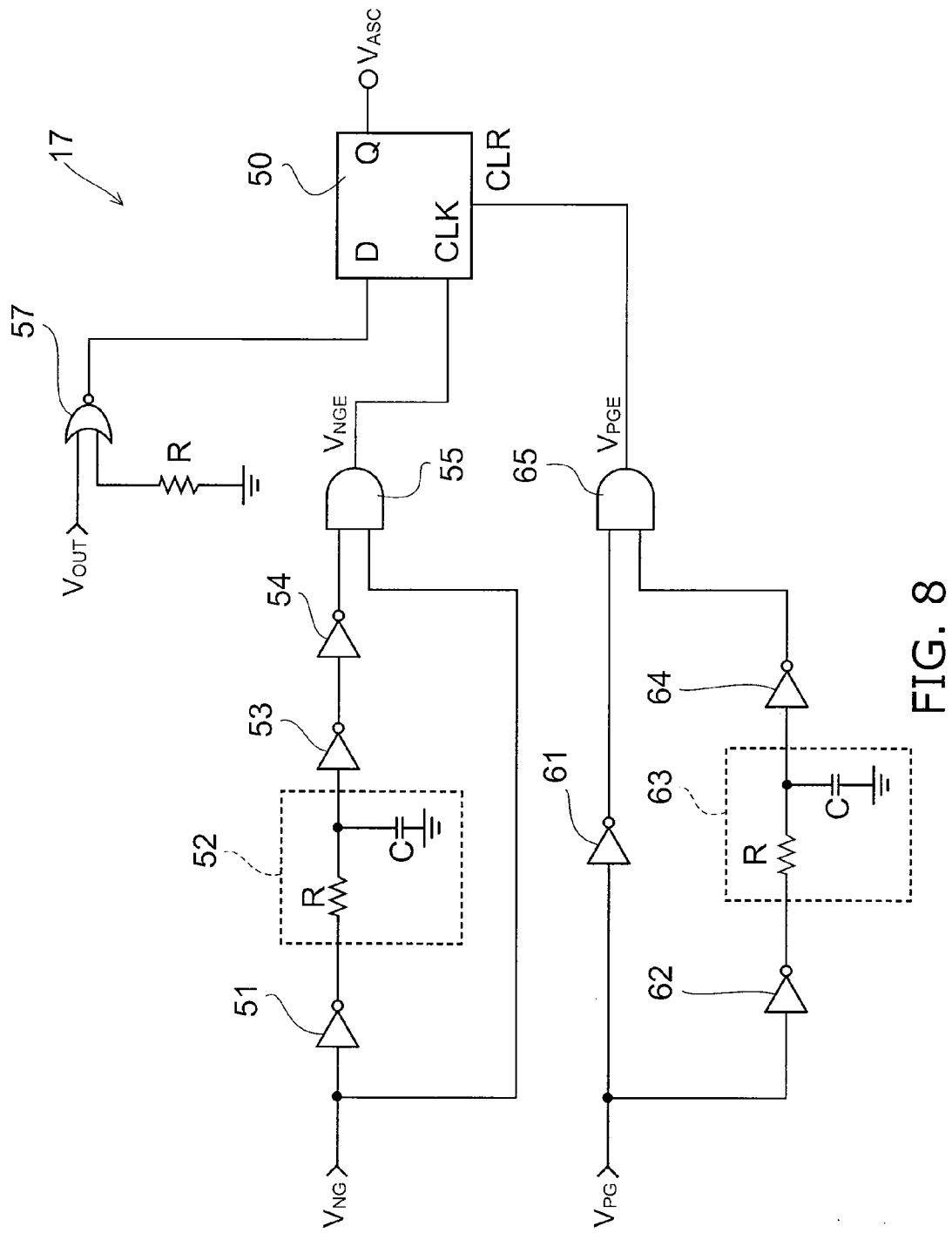
FIG. 8 is a schematic view illustrating a switch control circuit included in the receiving circuit according to the first embodiment.

FIG. 8 is a schematic view illustrating the switch control circuit 17. As shown in the figure, the gate control signals $V_{NG}$ and $V_{PG}$ are also input from the DTC circuit 15 to the switch control circuit 17.

The switch control circuit 17 includes a DFF (delayed flip flop) 50, outputs a switch control signal $V_{ASC}$ via its Q terminal, and controls the turning on and off of the analogue switch 19.

The output of a NOR gate 57 is supplied to the D terminal of the DFF 50. The output voltage $V_{OUT}$ and the $V_L$ (0 V) are input to the NOR gate 57. When the $V_{OUT}$ is the $V_L$, the $V_H$ is output from the NOR gate 57, whereas the $V_L$ is output, when the $V_{OUT}$ is the $V_H$. Instead of the output voltage $V_{OUT}$, the power supply voltage $V_{CC}$ may be input to the NOR gate 57.

In contrast, the output of an AND gate 55 is supplied to a CLK terminal. The gate control signal $V_{NG}$ and the $V_{NG}$ via an inverter 51, a delay circuit 52 and inverters 53 and 54 are input to the AND gate 55. Thereby, a pulse signal $V_{NGE}$ corresponding to the rise of the $V_{NG}$ is output from the AND gate 55. Then, an input level of the D terminal is held in the DFF 50 by the pulse signal $V_{NGE}$ input from the AND gate 55, and a signal voltage $V_{ASC}$ is output from the Q terminal corresponding to the level held in the DFF 50.

Furthermore, the output of an AND gate 65 is supplied to a CLR terminal. The gate control signal $V_{PG}$ inverted by an inverter 61 and the $V_{PG}$ via an inverter 62, a delay circuit 63 and an inverter 64 are input to the AND gate 65. Thereby, a pulse signal $V_{PGE}$ corresponding to the fall of the $V_{PG}$ is output from the AND gate 65. Then, the input of the D terminal that has been held in the DFF 50 is cleared by the pulse signal $V_{PGE}$ input from the AND gate 65, and the output of the Q terminal is also cleared.

Figure 9A:
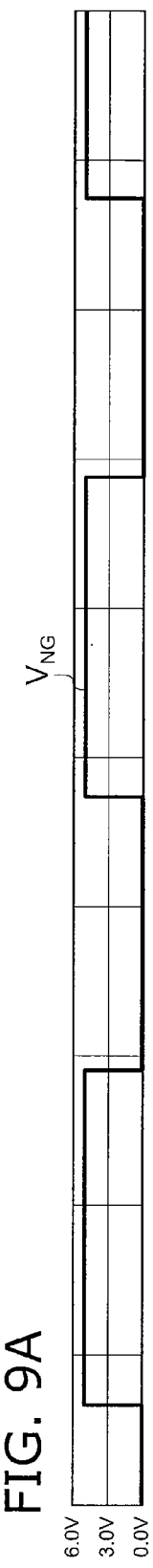
FIGS. 9A to 9F are time charts illustrating an operation of the switch control circuit.
Figure 9B:
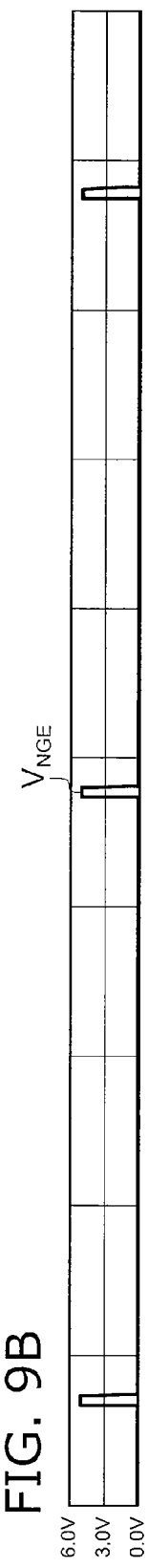
Figure 9C:
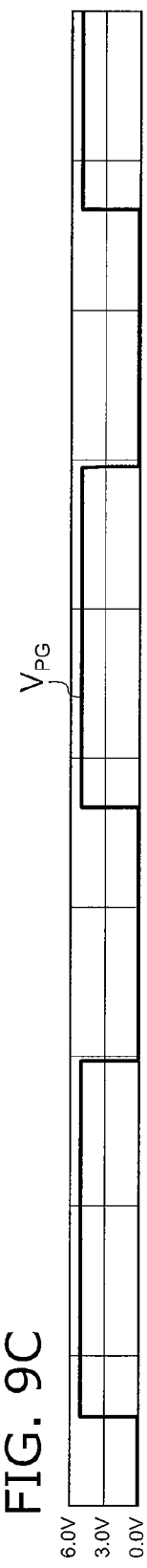
Figure 9D:
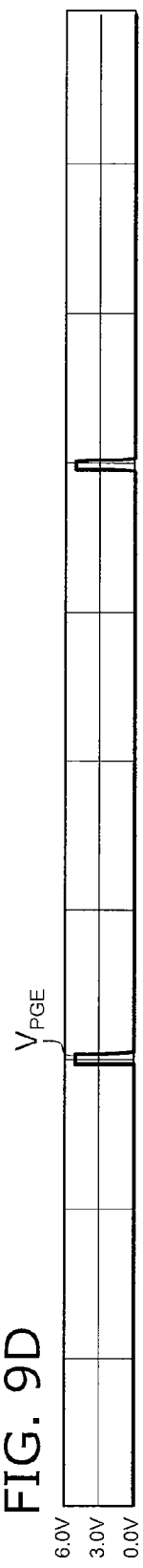
Figure 9E:
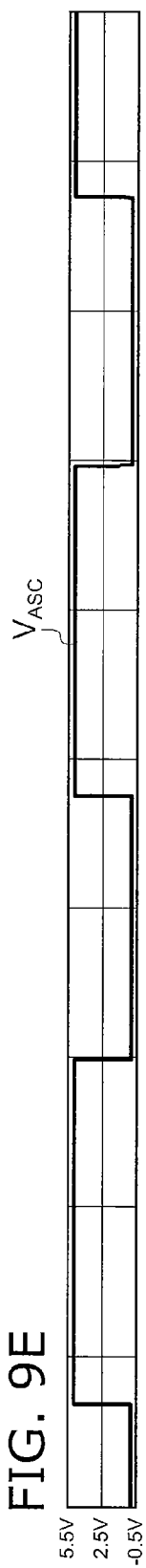
Figure 9F:
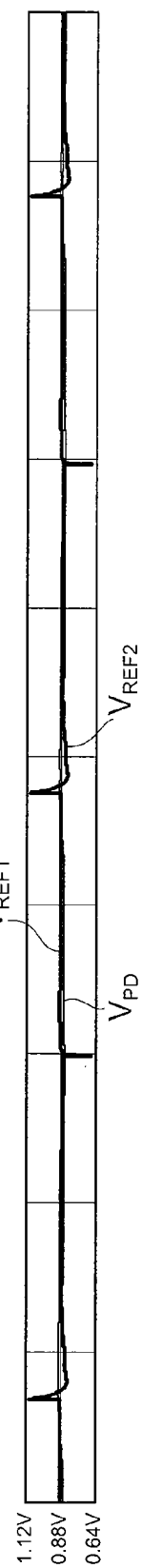

FIGS. 9A to 9F are time charts illustrating the operation of the switch control circuit 17. FIG. 9A shows the gate control signal $V_{NG}$, and FIG. 9B shows the pulse signal $V_{NGE}$ output from the AND gate 55. FIG. 9C shows the gate control signal $V_{PG}$, and FIG. 9D shows the pulse signal $V_{PGE}$ output from the AND gate 65. FIG. 9E shows the switch control signal $V_{ASC}$, and FIG. 9F shows variations in the reference voltage $V_{REF}$ and the signal voltage $V_{PD}$.

As shown in FIGS. 9A and 9B, the AND gate 55 outputs the pulse signal $V_{NGE}$ corresponding to the rise of the gate control signal $V_{NG}$.

In contrast, as shown in FIGS. 9C and 9D, the AND gate 65 outputs the pulse signal $V_{PGE}$ corresponding to the fall of the gate control signal $V_{PG}$.

The switch control signal $V_{ASC}$ shown in FIG. 9E is output from the Q terminal of the DFF 50. That is, the input of the D terminal is held in the DFF 50 by the pulse signal $V_{NGE}$ input to the CLK terminal. Here, since the output voltage $V_{OUT}$ is shifted to the $V_L$ in response to the rise of the $V_{NG}$, the $V_H$ is supplied to the D terminal. Thereby, the output $V_{ASC}$ of the Q terminal is held at the $V_H$ (5 V). Then, when the pulse signal $V_{PGE}$ is input to the CLR terminal, the input $V_H$ of the D terminal is cleared, and the output $V_{ASC}$ of the Q terminal is shifted to the $V_L$ (0 V).

Then, as shown in FIG. 9F, when the $V_{ASC}$ is the $V_H$, the analogue switch 19 becomes on-state, and the reference voltage $V_{REF}$ is decreased to the $V_{REF2}$. In contrast, when the $V_{ASC}$ is the $V_L$, the analogue switch 19 becomes off-state, and the reference voltage $V_{REF}$ is increased to the $V_{REF1}$.

Figure 10:
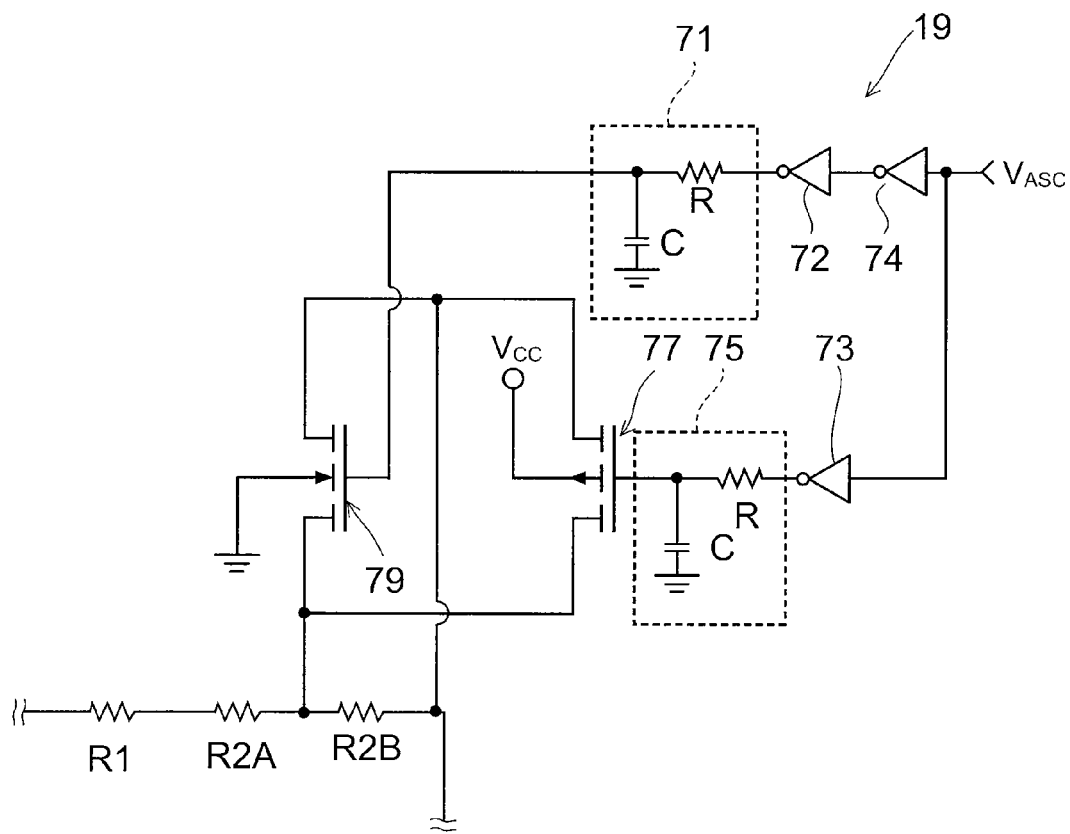
FIG. 10 is a schematic view illustrating the switch circuit according to the first embodiment.

FIG. 10 is a schematic view illustrating the analogue switch 19. As shown in the figure, the analogue switch 19 is a CMOS switch that includes a PMOS transistor 77 and an NMOS transistor 79 connected in parallel.

The switch control signal $V_{ASC}$ output from the switch control circuit 17 is applied to the gate of the NMOS transistor 79 via inverters 72 and 74 and a low-pass filter 71. The $V_{ASC}$ inverted by an inverter 73 is applied to the gate of the PMOS transistor 77 via a low-pass filter 75. The inverters 72 and 74 are provided so as to match the impedance on the side of the NMOS transistor 79 with the impedance of the PMOS transistor 77.

In this way, while the $V_{ASC}$ is at the level of the $V_H$, the PMOS transistor 77 and the NMOS transistor 79 are in on-state, establishing electrical continuity in the analogue switch 19. In contrast, while the $V_{ASC}$ is at the level of the $V_L$, the PMOS transistor 77 and the NMOS transistor 79 are in off-state, breaking the electrical continuity in the analogue switch 19.

The analogue switch 19 is preferably configured so as not to feed switching noise to the feedback resistor R2B. For example, by inserting the low-pass filters 71 and 75, the $V_{ASC}$ is gently shifted from the $V_L$ to the $V_H$ and from the $V_H$ to the $V_L$. Thereby, it is possible to reduce differentiation noise that results in switching noise.

Figure 11:
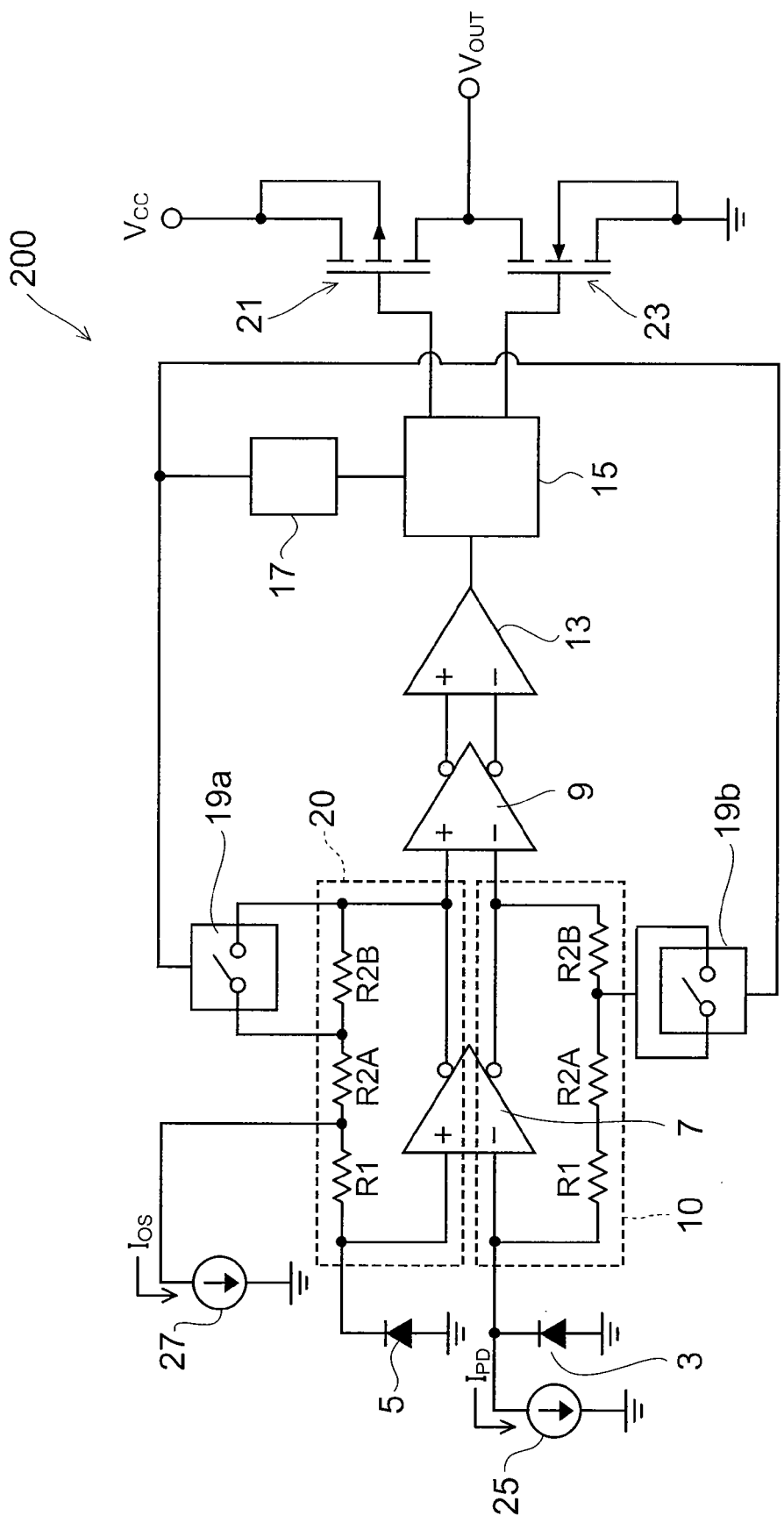
FIG. 11 is a schematic view illustrating a receiving circuit according to a variation of the first embodiment.

FIG. 11 is a schematic view showing a receiving circuit 200 according to a variation of the first embodiment. The receiving circuit 200 differs from the receiving circuit 100 shown in FIG. 1 in that, in the feedback circuit of the signal voltage generation portion 10, the same feedback resistors R1, R2A and R2B as the reference voltage generation portion 20 are provided, and that an analogue switch 19b is connected between the resistors R2A and R2B.

The analogue switch 19b has the same configuration as an analogue switch 19a that is connected in parallel to the feedback resistor R2B of the reference voltage generation portion 20. By the switch control signal $V_{ASC}$ output from the switch control circuit 17, the analogue switches 19a and 19b synchronize with each other and the turning on and off thereof is controlled.

The analogue switch 19b is a noise canceling circuit that generates switching noise equivalent to that of the analogue switch 19a, and they cancel each other and thus it is possible to suppress the malfunction of the receiving circuit 200.

As described above, in the receiving circuit 100 according to the embodiment, the analogue switch 19 is added to the feedback circuit of the TIA 7 included in the reference voltage generation portion 20, and the reference voltage $V_{REF}$ is made to have hysteresis, and thus it is possible to suppress chattering. Instead of the configuration of the receiving circuit 100 described here, for example, a monostable pulse signal is generated by the edge of the gate control signal $V_{NG}$, and the DFF 50 may be set or reset receiving the monostable pulse signal. The gate of the CMOS inverter in the output stage may be driven by the output of the Q terminal of the DFF 50.

Second Embodiment

Figure 12:
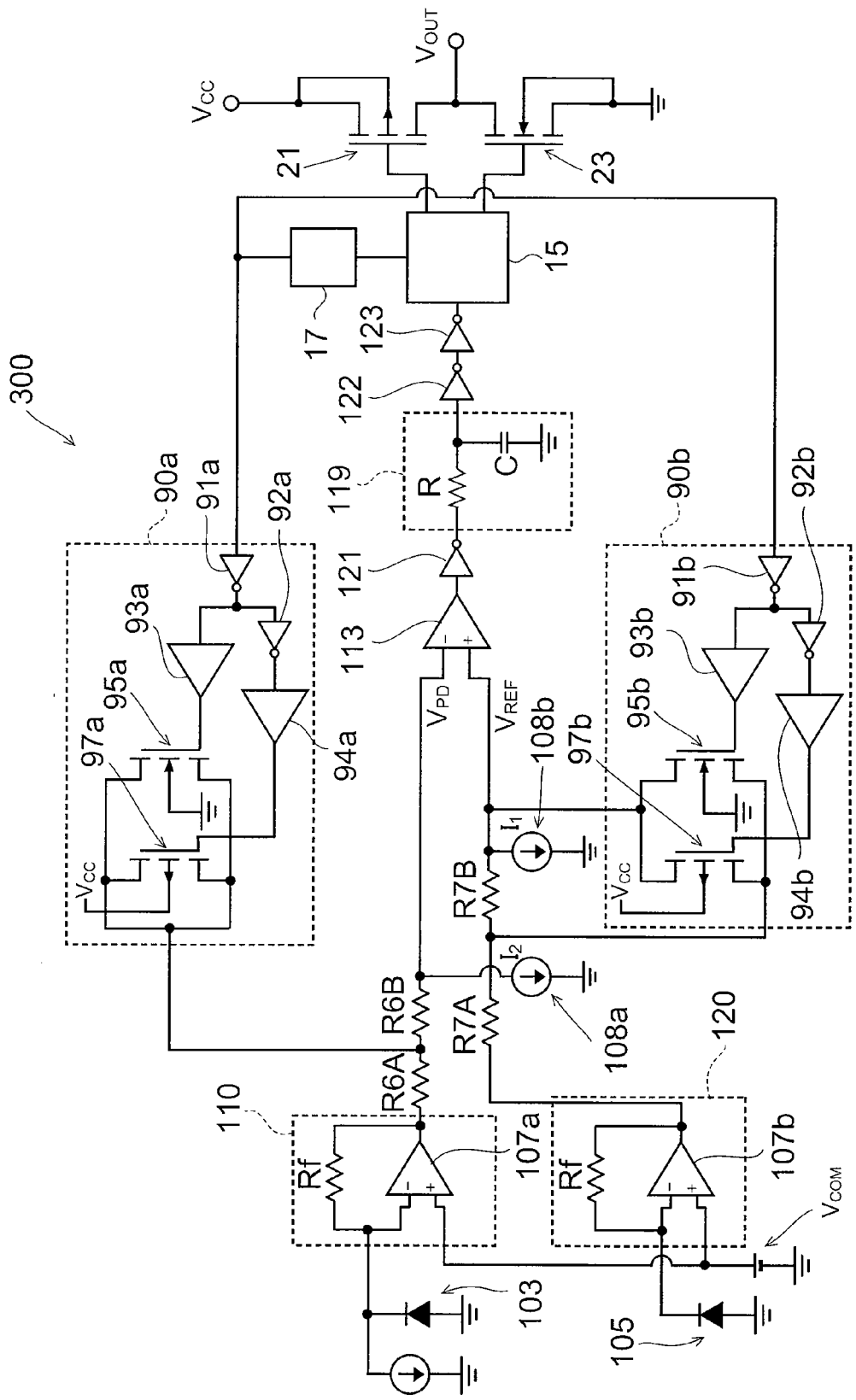
FIG. 12 is a schematic diagram illustrating a receiving circuit according to a second embodiment.

FIG. 12 is a schematic diagram showing a receiving circuit 300 according to a second embodiment. As shown in the figure, a photodiode 103 and a reference diode 105 equivalent to the photodiode 103 are provided in the input stage of the receiving circuit 300.

The photodiode 103 is connected to an input terminal on the negative side of a TIA 107a (a first transimpedance amplifier) included in a signal voltage generation portion 110. In contrast, the reference diode 105 is connected to an input terminal on the negative side of a TIA 107b (a second transimpedance amplifier) included in a reference voltage generation portion 120. A common potential $V_{COM}$ is supplied to input terminals on the positive side of the TIA 107a and the TIA 107b.

A signal voltage output from the TIA 107a and the reference voltage $V_{REF}$ output from the TIA 107b are input to a comparator 113. Resistors R6A and R6B and a constant current source 108a are provided between the output terminal of the TIA 107a and an input terminal of the comparator 113, and an offset voltage is added to the signal voltage $V_{PD}$. In contrast, resistors R7A and R7B and a constant current source 108b are provided also between the output terminal of the TIA 107b and the input terminal of the comparator 113, and an offset voltage is added to the reference voltage $V_{REF}$.

The output of the comparator 113 is inverted by an inverter 121, and is input to the DTC circuit 15 via a delay circuit 119 and inverters 122 and 123.

The DTC circuit 15 outputs, based on the output signal of the comparator 113, the gate control signal to the PMOS transistor 21 and the NMOS transistor 23 in the output stage and the control signal to the switch control circuit 17. Then, the switch control circuit 17 outputs the controls signals of analogue switches 90a and 90b.

In the same manner as the receiving circuit 200, the receiving circuit 300 according to the embodiment includes the analogue switch 90b which switches the offset voltage on the side of the reference voltage $V_{REF}$, based on the output of the comparator 113, and the analogue switch 90a which cancels the switching noise of the analogue switch 90b.

The analogue switch 90a is a CMOS switch including an NMOS transistor 95a and a PMOS transistor 97a, and is on/off-controlled by the output of the switch control circuit 17. The output of the switch control circuit 17 is inverted by an inverter 91a, and is input to the gate of the NMOS transistor 95a via an amplifier 93a. In contrast, the output of the switch control circuit 17 inverted by an inverter 91 is further inverted by an inverter 92a, and is input to the gate of the PMOS transistor 97a via an amplifier 94a. Thereby, the NMOS transistor 95a and the PMOS transistor 97a are turned on and off simultaneously.

The analogue switch 90b is a CMOS switch including an NMOS transistor 95b and a PMOS transistor 97b, and has the same configuration as the analogue switch 90a. That is, the output of the switch control circuit 17 is input to the gate of the NMOS transistor 95b via an inverter 91b and an amplifier 93b. The output of the switch control circuit 17 is input to the gate of the PMOS transistor 97b via the inverters 91b and 92b and an amplifier 94b.

The analogue switch 90b is connected in parallel to a resistor R7B provided on the side of the output of the TIA 107b, and reduces the offset voltage while it is in on-state. Because of this, the reference voltage $V_{REF}$ is made to have hysteresis $\Delta V_{hys}$, and chattering is reduced. In contrast, the analogue switch 90a is connected between the resistors R6A and R6B on the side of the output of the TIA 107a, whereby the switching noise of the analogue switch 90b is cancelled by injecting noise having the same phase therewith. The value of the resistor R6B is set to be the same as the resistor R7B provided on the reference voltage $V_{REF}$ side.

Figure 13:
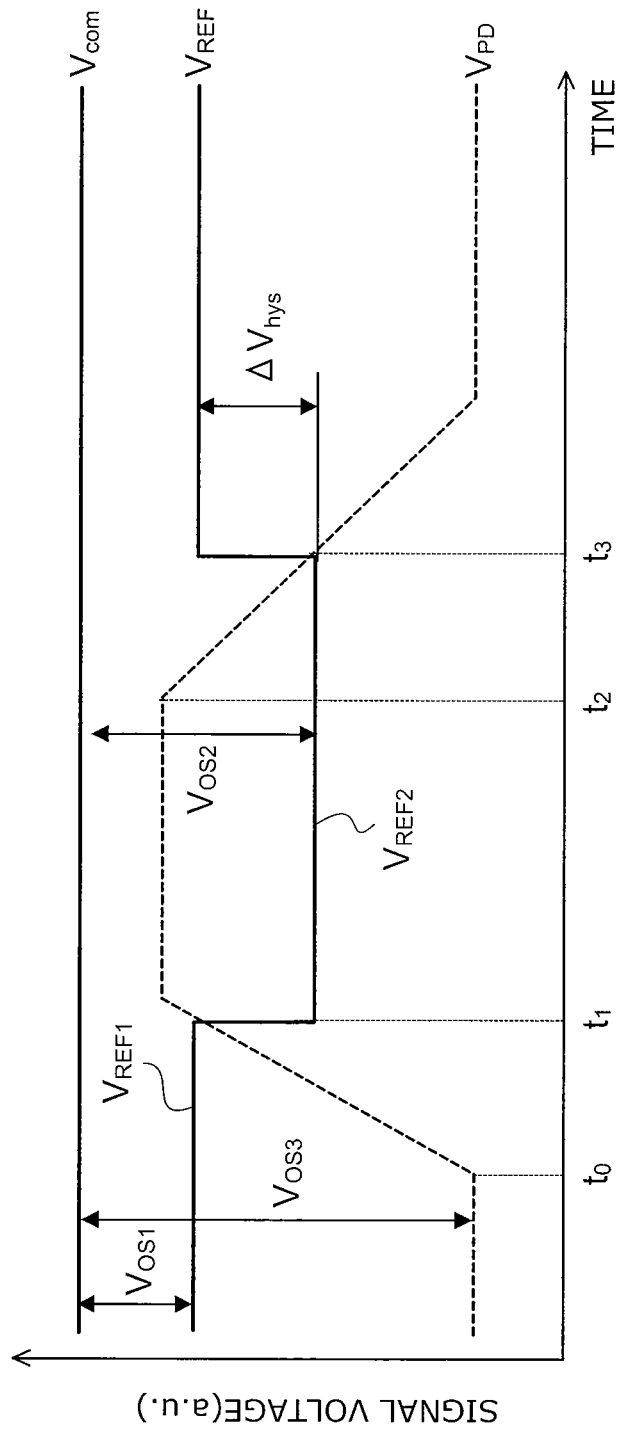
FIG. 13 is a time chart illustrating an operation of the receiving circuit according to the second embodiment.

FIG. 13 is a time chart showing the operation of the receiving circuit 300. In the receiving circuit 300, the input $V_{PD}$ of the comparator 113 is expressed by formula (7) below.

$$V_{PD} = V_{COM} + I_{PD} \times Rf - (R6A + R6B) \times I_2 \quad (7)$$
$$= V_{COM} + I_{PD} \times Rf - V_{OS3}$$

While the analogue switch 90b is in on-state, the reference voltage $V_{REF}$ is the first threshold value $V_{REF1}$ given by formula (8) below, whereas the reference voltage $V_{REF}$ is the second threshold value $V_{REF2}$ given by formula (9) below, while the analogue switch 90b is in off-state.

$$V_{REF1} = V_{COM} - R7A \times I_1 = V_{COM} - V_{OS1} \quad (8)$$

$$V_{REF2} = V_{COM} - (R7A + R7B) \times I_1 \quad (9)$$
$$= V_{COM} - V_{OS2}$$

For example, it may be assumed that R6A=R6B=R7A=R7B=10 kΩ, $I_1$=1.5 μA and $I_2$=2.5 μA, resulting in $V_{OS1}$=15 mV, $V_{OS2}$=30 mV and $V_{OS3}$=50 mV.

In FIG. 13, when t<$t_o$, no light signal is input, the output of the comparator is the high-level $V_H$ and the analogue switches 90a and 90b are in on-state. Hence, the reference voltage $V_{REF}$ is the first threshold value $V_{REF1}$.

The light signal is input at t=$t_o$ and the signal voltage starts to increase. When the signal voltage exceeds the first threshold value $V_{REF1}$, the output of the comparator 113 is inverted from the $V_H$ to the low-level $V_L$. Simultaneously, the analogue switches 90a and 90b are turned off, the reference voltage $V_{REF}$ is lowered to the second threshold value $V_{REF2}$.

Furthermore, When the light signal disappears at t=$t_3$ and the signal voltage $V_{PD}$ starts to decreased and becomes lower than the second threshold value $V_{REF2}$, the output of the comparator is inverted from the $V_L$ to the $V_H$. Then, the analogue switches 90a and 90b are turned on, and the reference voltage $V_{REF}$ is returned to the first threshold value $V_{REF1}$.

As described above, in the receiving circuit 300 according to the embodiment, the analogue switch 90b for switching the offset resistor is added to the side of the output of the TIA 107b included in the reference voltage generation portion 120, and thus the reference voltage $V_{REF}$ is made to have hysteresis $\Delta V_{hys}$, and thus it is possible to suppress chattering. Furthermore, by connecting the analogue switch 90a to the side of the output of the signal voltage generation portion 110, it is possible to cancel the switching noise of the analogue switch 90b.

FIGS. 14A to 14E are time charts showing the simulation result of the receiving circuit 300. FIG. 14A shows the output $V_{COMP}$ of the comparator 113. FIG. 14B shows the pulse signal $V_{PGE}$ output from the AND gate 65 in the switch control circuit 17, and FIG. 14C shows the pulse signal $V_{NGE}$ output from the AND gate 55. FIG. 14D shows the variation of the reference voltage $V_{REF}$ and the signal voltage $V_{PD}$. FIG. 14E shows the output $V_{OUT}$ of the receiving circuit 300.

As shown in FIGS. 14A to 14C, the turning on and off of the analogue switches 90a and 90b is controlled by the pulse signal $V_{PGE}$ corresponding to the fall of the output $V_{OUT}$ of the comparator 113 and the pulse signal $V_{NGE}$ corresponding to the rise.

As shown in FIG. 14D, when the signal voltage $V_{PD}$ exceeds the first threshold value $V_{REF1}$, the output of the comparator 113 is inverted. Then, the analogue switch 90b becomes off-state by the control signal $V_{ASC}$ output from the DFF 50 to which the pulse signal $V_{PGE}$ has been input, and the offset voltage is shifted from the $V_{OS1}$ to the $V_{OS2}$. Then, the reference voltage $V_{REF}$ is shifted to the second threshold value $V_{REF2}$. After that, when the signal voltage $V_{PD}$ becomes lower than the second threshold value $V_{REF2}$, the output $V_{COM}$ of the comparator 113 is further inverted, the analogue switches 90a and 90b become on-state by the control signal $V_{ASC}$ output from the DFF 50 to which the pulse signal $V_{NGE}$ has been input and the reference voltage $V_{REF}$ is returned to the first threshold value $V_{REF1}$.

As shown in FIG. 14E, the receiving circuit 300 is output the signal voltage $V_{OUT}$ having the same phase as the output $V_{COMP}$ of the comparator 113.

Third Embodiment

Figure 15:
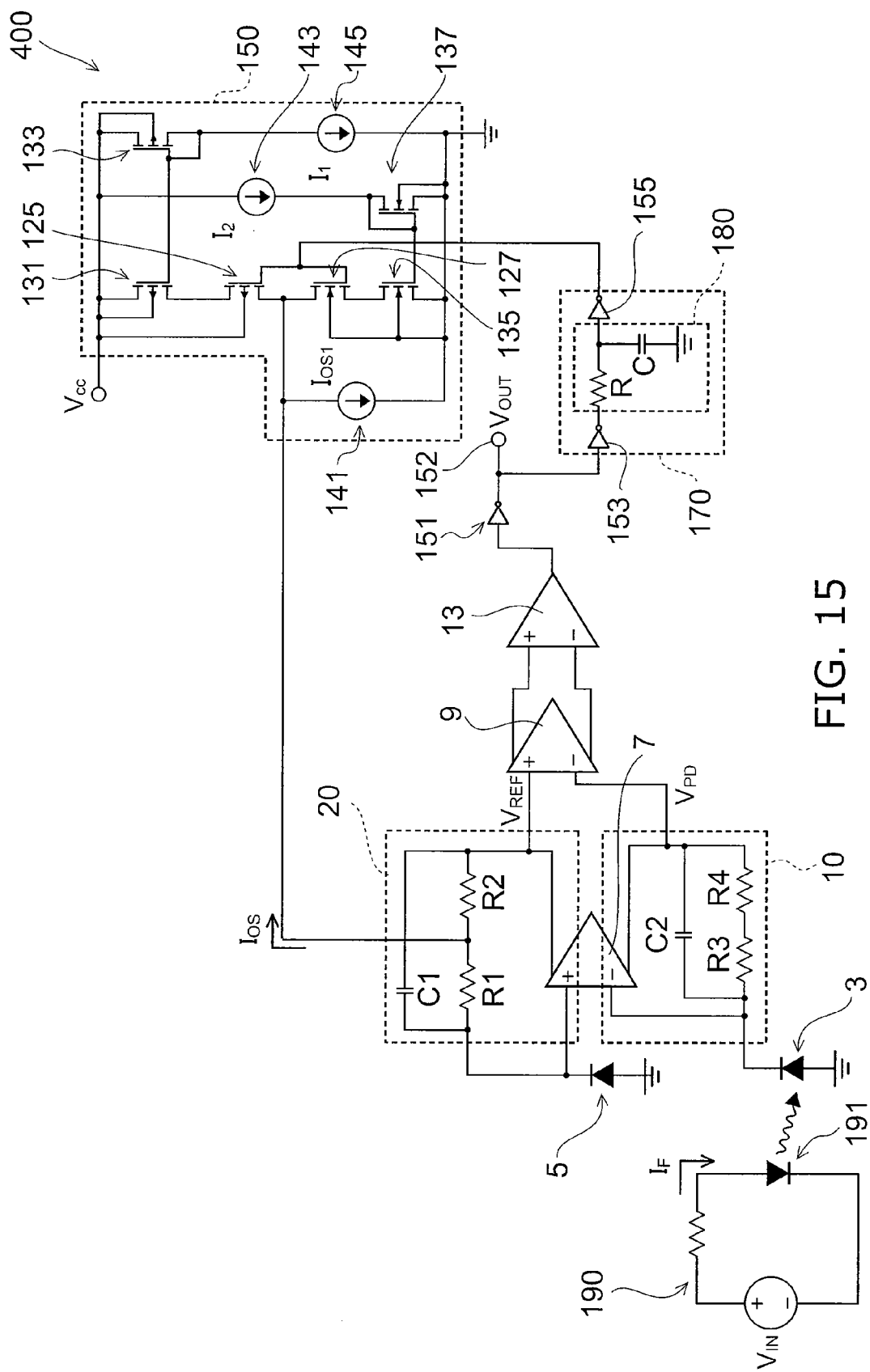
FIG. 15 is a schematic view illustrating a receiving circuit according to a third embodiment.

FIG. 15 is a schematic view showing a receiving circuit 400 according to a third embodiment. The receiving circuit 400 is, for example, a receiving portion of a photo-coupler, and detects the light emission of an LED 191 (light emitting diode) of a transmission portion 190.

The receiving circuit 400 includes the photodiode 3, the reference diode 5, the transimpedance amplifier (TIA) 7, the differential amplifier 9 and the comparator 13. Furthermore, in the embodiment, the receiving circuit 400 includes a switch circuit 150 for supplying the offset current $I_{OS}$ to a connecting point between the feedback resistors R1 and R2 in the TIA7.

The photodiode 3 is connected to the negative input side of the TIA 7, and the reference diode 5 is connected to the positive input side of the TIA 7. The reference diode 5 is equivalent to the photodiode 3.

The signal voltage generation portion 10 is provided on the negative input side of the TIA 7, and includes feedback resistors R3 and R4 and a feedback capacitor C2. The signal voltage generation portion 10 converts the light current of the photodiode 3 into the signal voltage $V_{PD}$ and outputs it. The reference voltage generation portion 20 is provided on the positive input side of the TIA 7, and includes the feedback resistors R1 and R2 and a feedback capacitor C1. The reference voltage generation portion 20 outputs the reference voltage $V_{REF}$.

The feedback resistors R3 and R4 provided in the signal voltage generation portion 10 and the feedback resistors R1 and R2 provided in the reference voltage generation portion 20 satisfy a relationship between formulas (10) and (11) below, and the TIA 7 operates in all differential modes.

$$R1+R2=R3+R4 \tag{10}$$

$$C1=C2$$

The outputs $V_{PD}$ and $V_{REF}$ of the TIA 7 are amplified by the differential amplifier 9, and are input to the comparator 13. The reference voltage $V_{REF}$ serves as a threshold value that determines the level of the signal voltage $V_{PD}$ and the comparator 13 outputs the voltage $V_H$ or $V_L$ depending on the level of $V_{PD}$.

In the receiving circuit 400, the photodiode 3 is equivalent to the reference diode 5. Therefore, when no light signal is input, the voltage levels of the outputs $V_{PD}$ and $V_{REF}$ of the TIA 7 are equal to each other. Accordingly, by supplying the offset current $I_{OS}$ between the feedback resistors R1 and R2 of the reference voltage generation portion 20, the offset voltage $V_{OS}$ is added to the reference voltage $V_{REF}$. Hence, a potential difference between the $V_{PD}$ and the $V_{REF}$ is produced, and the output of the comparator 13 is stabilized.

Furthermore, in the embodiment, the switch circuit 150 varies the offset current $I_{OS}$ and hysteresis is produced in the reference voltage $V_{REF}$. Thereby, chattering is suppressed in the output voltage $V_{OUT}$.

The switch circuit 150 switches the offset current $I_{OS}$ by following variations in the output voltage $V_{OUT}$. An output determination circuit 170 is provided between an output terminal 152 and the switch circuit 150. The output determination circuit 170 includes an inverter 153 and an inverter 155 which are connected in series. Furthermore, a low-pass filter 180 may be provided between the inverter 153 and the inverter 155.

The switch circuit 150 includes an offset current source 141 that outputs an offset current $I_{OS1}$. A CMOS inverter including a PMOS transistor 125 and an NMOS transistor 127 is operated by the output voltage $V_{OUT}$, and varies the offset current $I_{OS}$.

For example, when the voltage $V_H$ is input to the gate of the CMOS inverter, the NMOS transistor 125 is turned off, and the NMOS transistor 127 is turned on. Because of this, a current mirror circuit including an NMOS transistor 135 and an NMOS transistor 137 operates. When the current ratio between the NMOS transistor 135 and the NMOS transistor 137 is 1:1, the same current as the output $I_2$ of a constant current source 143 connected to the NMOS transistor 137 is added to the $I_{OS}$.

In contrast, when the voltage $V_L$ is input to the gate of the CMOS inverter, the NMOS transistor 125 is turned on, and the NMOS transistor 127 is turned off. Then, a current mirror circuit including a PMOS transistor 131 and a PMOS transistor 133 operates. When the current ratio between the PMOS transistor 131 and the PMOS transistor 133 is 1:1, the same current as the output $I_1$ of a constant current source 145 connected to the PMOS transistor 133 flows through the offset current source 141, and thus the $I_{OS}$ becomes a current value obtained by subtracting the $I_1$ from the $I_{OS1}$.

When the output voltage $V_{OUT}$ is the $V_H$, the offset current $I_{OS}$ is $I_{OS1}+I_2$, whereas the offset current $I_{OS}$ is $I_{OS1}-I_1$, when the $V_{OUT}$ is the $V_L$.

For example, when the light receiving surface of the reference diode 5 is completely shielded, and no light current is output, the reference voltage $V_{REF}$ is equal to the offset voltage $V_{OS}$ ($=R2 \times I_{OS}$), and is expressed by formulas (12) and (13) below, where $I_{OS1} > I_1$.

$$V_{REF1}=R2 \times (I_{OS1}+I_2)(V_{OUT}=V_H) \tag{12}$$

$$V_{REF2}=R2 \times (I_{OS1}-I_1)(V_{OUT}=V_L) \tag{13}$$

As shown in FIG. 15, in the receiving circuit 400, the output of the comparator 13 is inverted by an inverter 151 and is output to the output terminal 152 as $V_{OUT}$. Therefore, when the signal voltage $V_{PD}$ is varied from the low level (L) to the high level (H) at the input side of the comparator 13, the reference voltage $V_{REF}$ is varied from the $V_{REF1}$ to the $V_{REF2}$, and the hysteresis $\Delta V_{hys}$ is produced as expressed by formula (14) below.

$$\Delta V_{hys}=R2 \times (I_1+I_2) \tag{14}$$

Furthermore, at the cross point where the output of the comparator 13 is inverted, the drive currents $I_{FH}$ (L→H) and $I_{FL}$ (H→L) of the LED 191 are expressed by formulas (15) and (16) below, $$I_{FH}=M \times [R2/(R1+R2)] \times (I_{OS1}+I_2) \tag{15}$$

$$I_{FL}=M \times [R2/(R1+R2)] \times (I_{OS1}-I_1) \tag{16}$$

where M is the conversion ratio in the light connection, that is, the ratio between the drive current $I_F$ of the LED 191 and the light current of the photodiode 3.

Therefore, hysteresis $I_{Fhys}$ in the drive current $I_F$ of the LED 191 is expressed by formula (17) below.

$$I_{Fhys}=M \times [R2/(R1+R2)] \times (I_1+I_2) \tag{17}$$

Figure 17A:
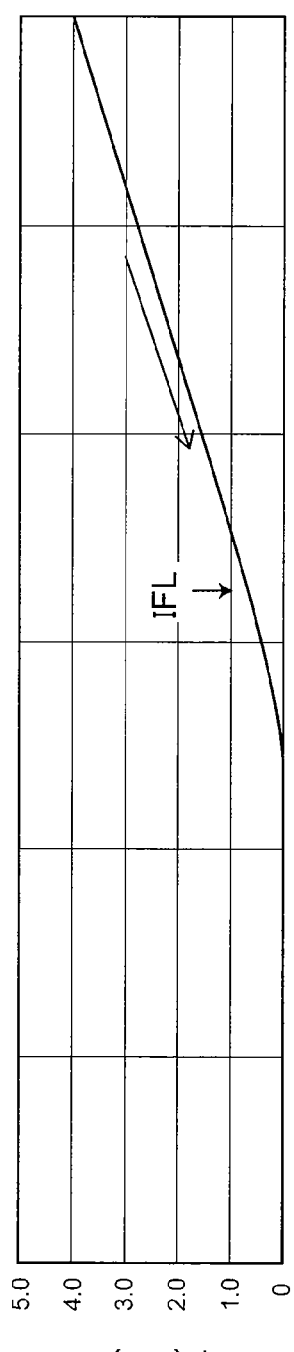
Figure 17B:
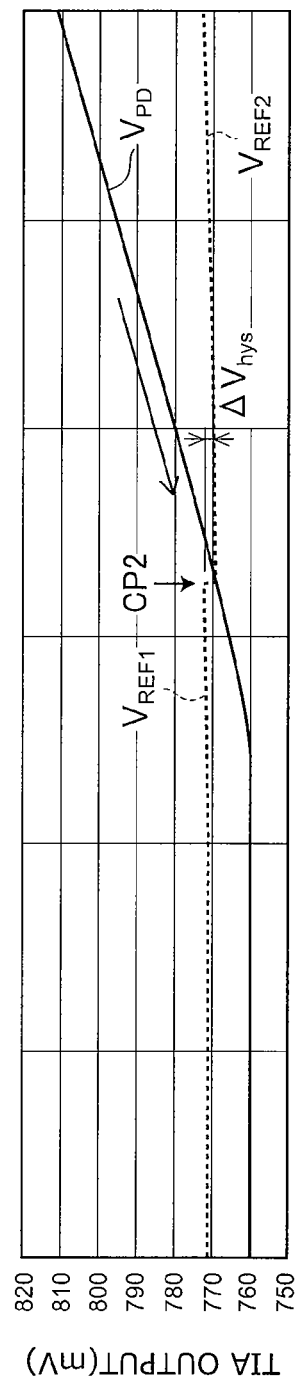
Figure 17C:
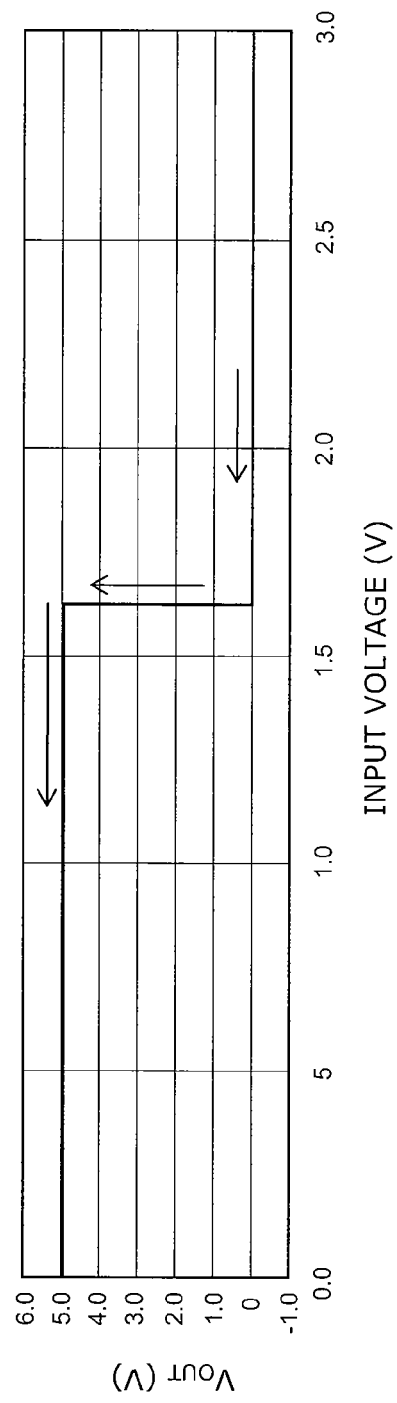

FIGS. 16A to 17C are charts showing the simulation results of the characteristics of the receiving circuit 400. FIGS. 16A to 16C show the outputs $V_{REF}$ and $V_{PD}$ of the TIA 7 and the output voltage $V_{OUT}$ when the drive current $I_F$ of the LED 191 is varied from L to H. The horizontal axis is the input voltage $V_{IN}$ of the transmission portion 190. FIGS. 17A to 17C show the individual characteristics, when the drive current $I_F$ of the LED 191 is varied from H to L.

In FIG. 16A, the input voltage $V_{IN}$ is varied from the L level to the H level. Accordingly, the drive current $I_F$ of the transmission portion 190 is increased. As shown in FIG. 16B, the $V_{PD}$ is also increased and intersects with the reference value $V_{REF1}$ at a cross point 1 (CP1). For example, the drive current $I_{FH}$ of the LED 191 corresponding to the CP1 is 1 mA, and an input voltage at that time is about 1.75 V.

Moreover, at the CP1, the output of the comparator 13 is inverted from L to H, and the output voltage $V_{OUT}$ is inverted from H to L. Then, the offset current $I_{OS}$ is varied from $I_{OS1}+I_2$ to $I_{OS1}-I_1$, and the offset voltage $V_{OS}$ is decreased. Thereby, the reference voltage $V_{REF}$ is decreased to the $V_{REF2}$, and the hysteresis $\Delta V_{hys}$ is produced.

Next, in FIG. 17A, the input voltage $V_{IN}$ is varied from the H level to the L level. Accordingly, the drive current $I_F$ of the LED 191 is reduced. As shown in FIG. 17B, the $V_{PD}$ is decreased and intersects with the reference voltage $V_{REF2}$ at a cross point (CP2). For example, the drive current $I_{FL}$ of the LED 191 corresponding to the CP2 is 0.8 mA, and the input voltage at that time is about 1.62 V. The hysteresis $I_{Fhys}$ of the drive current $I_{FL}$ is about 0.2 mA, and the voltage at the cross point is decreased by about 0.13 V.

Furthermore, at the CP2, the output of the comparator 13 is inverted from H to L, and the output voltage $V_{OUT}$ is inverted from L to H. Then, the offset current $I_{OS}$ is varied from $I_{OS1}-I_1$ to $I_{OS1}+I_2$, and the reference voltage $V_{REF}$ is increased to the $V_{REF1}$.

Figure 18:
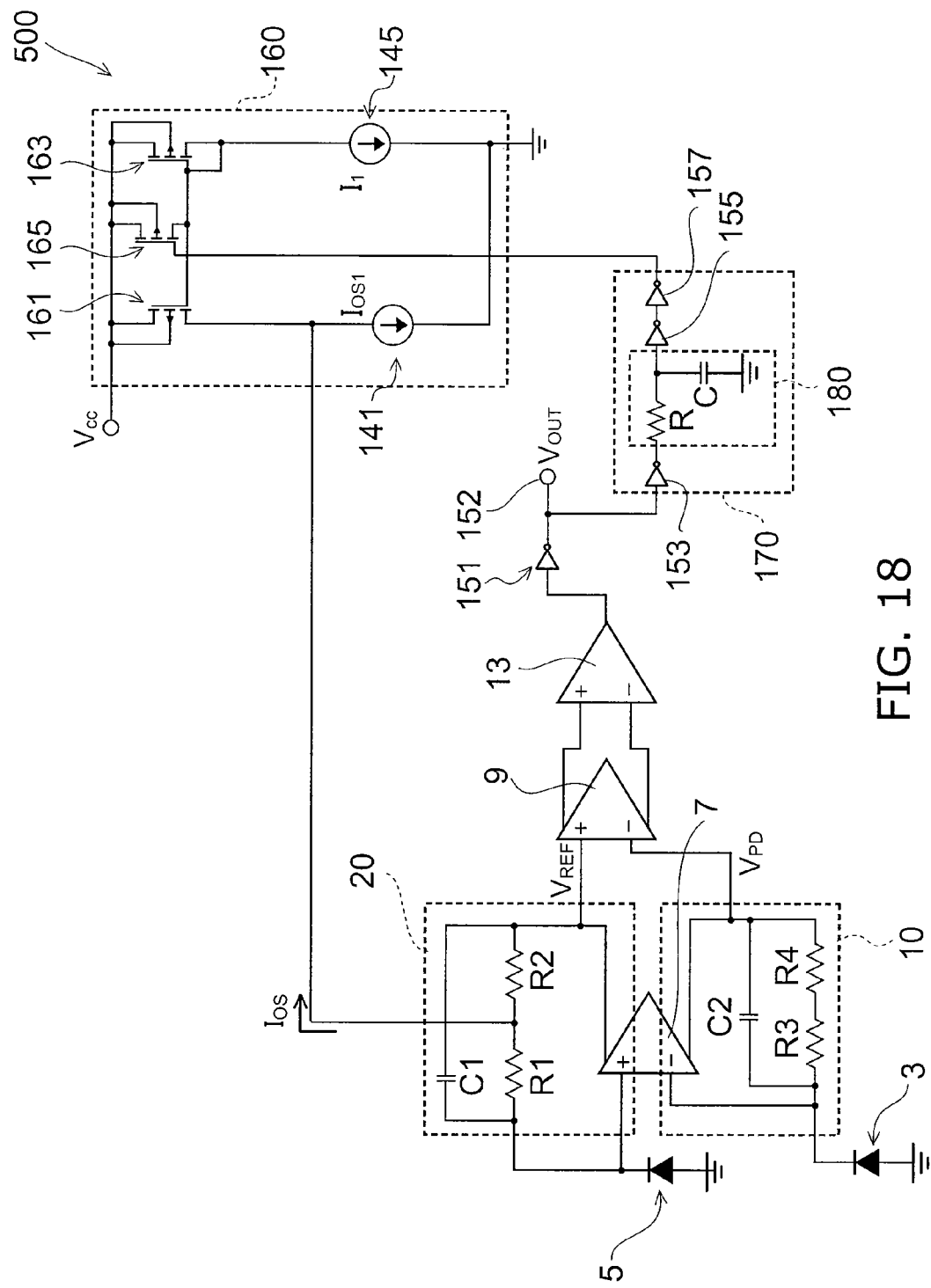
FIG. 18 is a schematic view illustrating a receiving circuit according to a variation of the third embodiment.

Next, a receiving circuit 500 according to a variation of the embodiment will be described with reference to FIG. 18.

The receiving circuit 500 includes the photodiode 3, the reference diode 5, the transimpedance amplifier (TIA) 7, the differential amplifier 9 and the comparator 13. Furthermore, the receiving circuit 500 includes a switch circuit 160 for supplying the offset current $I_{OS}$ between the feedback resistors R1 and R2 in the TIA 7.

The photodiode 3 is connected to the negative input side of the TIA 7, and the reference diode 5 is connected to the positive input side of the TIA 7. The reference diode 5 is equivalent to the photodiode 3.

The signal voltage generation portion 10 is configured on the negative input side of the TIA 7, and includes the feedback resistors R3 and R4 and the feedback capacitor C2. The signal voltage generation portion 10 converts the light current of the photodiode 3 into the signal voltage $V_{PD}$ and outputs it. The reference voltage generation portion 20 is configured on the positive input side of the TIA 7, and includes the feedback resistors R1 and R2 and the feedback capacitor C1. The reference voltage generation portion 20 outputs the reference voltage $V_{REF}$.

The feedback resistors R3 and R4 provided in the signal voltage generation portion 10 and the feedback resistors R1 and R2 provided in the reference voltage generation portion 20 satisfy a relationship between formulas (10) and (11), and the TIA 7 operates in all differential modes.

The outputs $V_{PD}$ and $V_{REF}$ of the TIA 7 are amplified by the differential amplifier 9, and are input to the comparator 13. The reference voltage $V_{REF}$ serves as a threshold value that determine the level of the signal voltage $V_{PD}$ and the comparator outputs the voltage $V_H$ or $V_L$ depending on the level of $V_{PD}$.

Furthermore, the output voltage $V_{OUT}$ inverted by the inverter 151 is fed back through the switch circuit 160, thus switching the offset current $I_{OS}$.

The output determination circuit 170 is provided between the output terminal $V_{OUT}$ and the switch circuit 160. The output determination circuit 170 includes the inverter 153 and the inverter 155 which are connected in series. Moreover, the low-pass filter 180 may be provided between the inverter 153 and the inverter 155. The output voltage $V_{OUT}$ is inverted by an inverter 157, and is input to the switch circuit 160.

The switch circuit 160 includes the offset current source 141 that outputs the offset current $I_{OS1}$. A PMOS transistor 165 is operated by the output voltage $V_{OUT}$ and varies the offset current $I_{OS}$.

For example, when the voltage $V_H$ is input to the gate of the PMOS transistor 165, the PMOS transistor 165 is turned off, and the gate voltage of PMOS transistors 161 and 163 is decreased, turning on the PMOS transistors 161 and 163. Thus, a current mirror circuit including the PMOS transistor 161 and a PMOS transistor 163 is operated. If the current ratio between the PMOS transistor 161 and the PMOS transistor 163 is 1:1, the same current as the output $I_1$ of a constant current source 145 connected to the PMOS transistor 163 flows through the offset current source 141. Because of this, the offset voltage $V_{OS}$ is decreased to $I_{OS1}-I_1$, and the reference voltage $V_{REF}$ is lowered.

The output voltage of the comparator 13 is inverted by the inverter 151 and the inverted voltage thereof is output to the output terminal 152 as $V_{OUT}$. Then, the $V_{OUT}$ is input to the gate of the PMOS transistor 165 via the output determination circuit 170 that inverts an input voltage. As a result, the voltage level input to the gate of the PMOS transistor 165 is the same with the output voltage of the comparator 13. That is, when the $V_H$ is input to the gate of the PMOS transistor 165, the output voltage of the comparator 13 is $V_H$ and the reference voltage $V_{REF}$ is lowered.

In contrast, while the output of the comparator 13 is $V_L$, the voltage $V_L$ is input to the gate of the PMOS transistor 165. Then, the PMOS transistor 165 is turned on, and the gate voltage of the PMOS transistors 161 and 163 is increased, turning off the PMOS transistors 161 and 163. Then, the offset current is increased to $I_{OS1}$, and the reference voltage $V_{REF}$ is increased. Thus, hysteresis is produced in the reference voltage $V_{REF}$, and thus it is possible to suppress chattering in the output voltage $V_{OUT}$.

As described above, in the embodiment, the switch circuits 150 and 160 switch the offset current $I_{OS}$ added to the reference voltage generation portion 20, and thus the offset voltage $V_{OS}$ is varied and hysteresis is produced in the reference voltage $V_{REF}$. Because of this, malfunction in the output voltage $V_{OUT}$ is suppressed.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A receiving circuit comprising:
   a light receiving element receiving a light signal and outputting a light current corresponding to the light signal;
   a signal voltage generation portion converting the light current into a signal voltage and outputting the signal voltage;
   a comparator comparing the signal voltage with a first threshold value or a second threshold value;
   a reference voltage generation portion outputting a reference voltage input to the comparator; and
   a switch changing the reference voltage to one of the first threshold value and the second threshold value based on an output of the comparator.

2. The circuit according to claim 1, wherein the reference voltage generation portion includes a reference diode equivalent to the light receiving element.

3. The circuit according to claim 2, wherein
   the light receiving element is a photodiode, and
   the reference diode is provided on the same substrate as the photodiode and has a shielded light receiving surface.

4. The circuit according to claim 1, wherein
the reference voltage generation portion includes a transimpedance amplifier, and
the switch changes a value of a feedback resistor of the transimpedance amplifier.

5. The circuit according to claim 1, further comprising:
a resistor provided between an output terminal of the reference voltage generation portion and an input terminal of the comparator,
wherein the switch changes a value of the resistor.

6. The circuit according to claim 1, wherein the reference voltage includes an offset voltage.

7. The circuit according to claim 6, wherein the switch varies the offset current and switches the reference voltage.

8. The circuit according to claim 7, wherein the switch includes a current mirror circuit.

9. The circuit according to claim 7, wherein
the reference voltage generation portion includes a transimpedance amplifier, and
the switch changes an offset current flowing through a feedback resistor of the transimpedance amplifier.

10. The circuit according to claim 9, wherein the transimpedance amplifier includes a plurality of feedback resistors connected in series, and the offset current is supplied between the plurality of feedback resistors.

11. The circuit according to claim 1, wherein the signal voltage generation portion and the reference voltage generation portion include a common transimpedance amplifier that operates in a differential mode.

12. The circuit according to claim 11, wherein a differential amplifier is provided between the transimpedance amplifier and the comparator.

13. The circuit according to claim 1, wherein the reference voltage generation portion includes a first transimpedance amplifier, and the signal voltage generation portion includes a second transimpedance amplifier.

14. The circuit according to claim 1, wherein the switch further includes a noise canceling circuit which generates noise equivalent to switching noise, and an output of the noise canceling circuit is input to the signal voltage generation portion.

15. The circuit according to claim 14, wherein the noise canceling circuit is on/off-controlled in synchronization with the switch circuit.

16. The circuit according to claim 1, further comprising:
an output stage including a CMOS converter operating in accordance with an output of the comparator; and
a DTC circuit provided between the output stage and the comparator.

17. The circuit according to claim 1, further comprising a switch circuit controlling the switch in accordance with an output of the comparator.

18. The circuit according to claim 17, wherein the switch circuit includes a DFF (Delayed Flip Flop).

19. The circuit according to claim 1, wherein the switch includes a CMOS switch and operates in analog mode.

20. The circuit according to claim 19, wherein the switch includes a low-pass filter.

\* \* \* \* \*